United States Patent
Momoi et al.

(10) Patent No.: US 9,724,896 B2
(45) Date of Patent: Aug. 8, 2017

(54) COPPER HEAT DISSIPATION MATERIAL, CARRIER-ATTACHED COPPER FOIL, CONNECTOR, TERMINAL, LAMINATE, SHIELD MATERIAL, PRINTED-WIRING BOARD, METAL PROCESSED MEMBER, ELECTRONIC DEVICE AND METHOD FOR MANUFACTURING THE PRINTED WIRING BOARD

(71) Applicant: JX NIPPON MINING & METALS CORPORATION, Tokyo (JP)

(72) Inventors: Hajime Momoi, Tokyo (JP); Satoru Morioka, Tokyo (JP); Toshiyuki Ono, Ibaraki (JP); Hideta Arai, Ibaraki (JP); Ryo Fukuchi, Ibaraki (JP); Atsushi Miki, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 99 days.

(21) Appl. No.: 14/919,357

(22) Filed: Oct. 21, 2015

(65) Prior Publication Data
US 2016/0120017 A1 Apr. 28, 2016

(30) Foreign Application Priority Data
Oct. 22, 2014 (JP) .................. 2014-215826

(51) Int. Cl.
*H01L 23/373* (2006.01)
*H05K 1/03* (2006.01)
(Continued)

(52) U.S. Cl.
CPC ............ *B32B 15/20* (2013.01); *B32B 7/12* (2013.01); *B32B 15/01* (2013.01); *B32B 15/08* (2013.01);
(Continued)

(58) Field of Classification Search
CPC .......... H01L 23/3732; H01L 23/142; H01L 23/3731; H01L 2924/0002; H01L 23/3736; H01L 23/3735; H05K 1/0306; H05K 2201/0355; H05K 2201/0209; H05K 3/025; H05K 1/09; B32B 15/08; B32B 2457/08; B32B 27/20; B32B 27/36; B32B 15/01;
(Continued)

(56) References Cited

U.S. PATENT DOCUMENTS 4,546,065 A * 10/1985 Amendola ............ C04B 41/009
    29/847
4,865,877 A * 9/1989 Yamaguchi ........... C04B 41/009
    427/305
(Continued)

FOREIGN PATENT DOCUMENTS

JP    07-094644 A    4/1995
JP    08-078461 A    3/1996

*Primary Examiner* — Adam B Dravininkas
(74) *Attorney, Agent, or Firm* — Drinker Biddle & Reath LLP

(57) ABSTRACT

A copper heat dissipation material having a satisfactory heat dissipation performance is provided. The copper heat dissipation material has an alloy layer containing at least one metal selected from Cu, Co, Ni, W, P, Zn, Cr, Fe, Sn and Mo on one or both surfaces, in which surface roughness Sz of the one or both surfaces, measured by a laser microscope using laser light of 405 nm in wavelength, is 5 μm or more.

21 Claims, 2 Drawing Sheets

(51) Int. Cl.
| | |
|---|---|
| B32B 15/08 | (2006.01) |
| B32B 15/20 | (2006.01) |
| B32B 15/01 | (2006.01) |
| B32B 37/02 | (2006.01) |
| C25D 7/06 | (2006.01) |
| H05K 1/09 | (2006.01) |
| H05K 3/02 | (2006.01) |
| B32B 7/12 | (2006.01) |
| B32B 15/18 | (2006.01) |
| B32B 27/18 | (2006.01) |
| B32B 27/20 | (2006.01) |
| B32B 27/28 | (2006.01) |
| B32B 27/30 | (2006.01) |
| B32B 27/32 | (2006.01) |
| B32B 27/34 | (2006.01) |
| B32B 27/36 | (2006.01) |
| B32B 27/38 | (2006.01) |
| B32B 15/04 | (2006.01) |

(52) U.S. Cl.
CPC .............. *B32B 15/18* (2013.01); *B32B 27/18* (2013.01); *B32B 27/20* (2013.01); *B32B 27/281* (2013.01); *B32B 27/304* (2013.01); *B32B 27/322* (2013.01); *B32B 27/34* (2013.01); *B32B 27/36* (2013.01); *B32B 27/38* (2013.01); *B32B 37/02* (2013.01); *C25D 7/06* (2013.01); *H05K 1/09* (2013.01); *H05K 3/025* (2013.01); *B32B 15/043* (2013.01); *B32B 2255/06* (2013.01); *B32B 2255/205* (2013.01); *B32B 2255/26* (2013.01); *B32B 2307/202* (2013.01); *B32B 2307/302* (2013.01); *B32B 2307/538* (2013.01); *B32B 2457/00* (2013.01); *B32B 2457/08* (2013.01); *B32B 2457/20* (2013.01); *B32B 2457/202* (2013.01); *H01L 23/3735* (2013.01); *H01L 23/3736* (2013.01); *H01L 2924/0002* (2013.01); *H05K 2201/0338* (2013.01); *H05K 2201/0355* (2013.01); *H05K 2201/0358* (2013.01)

(58) Field of Classification Search
CPC ................ B32B 15/20; B32B 2457/00; B32B 2307/538; B32B 27/322; B32B 27/38; B32B 27/281; B32B 27/18; B32B 15/18; B32B 27/34; B32B 7/12; B32B 2255/26; B32B 2255/06; B32B 15/043; C25D 7/06
See application file for complete search history.

(56) References Cited

U.S. PATENT DOCUMENTS

| | | | | |
|---|---|---|---|---|
| 5,034,357 | A * | 7/1991 | Yamakawa | C04B 35/581 257/E23.009 |
| 5,294,381 | A * | 3/1994 | Iguchi | H01L 21/4803 257/E23.111 |
| 5,891,291 | A * | 4/1999 | Okamoto | B30B 7/02 156/272.2 |
| 6,299,942 | B1 * | 10/2001 | Tamura | C23C 18/1641 427/304 |
| 6,335,281 | B1 * | 1/2002 | Segi | C23C 16/4581 438/680 |
| 6,558,821 | B1 * | 5/2003 | Shinosawa | B24B 1/00 257/E23.009 |
| 2001/0051682 | A1 * | 12/2001 | Tamura | C23C 18/1653 524/400 |
| 2002/0164475 | A1 * | 11/2002 | Imamura | C01B 21/068 428/325 |
| 2004/0016570 | A1 * | 1/2004 | Yamamoto | H01L 23/15 174/261 |
| 2012/0288698 | A1 * | 11/2012 | Moldovan | C25D 1/04 428/216 |
| 2014/0345843 | A1 * | 11/2014 | Kirkor | F28F 23/00 165/185 |

\* cited by examiner

COPPER HEAT DISSIPATION MATERIAL, CARRIER-ATTACHED COPPER FOIL, CONNECTOR, TERMINAL, LAMINATE, SHIELD MATERIAL, PRINTED-WIRING BOARD, METAL PROCESSED MEMBER, ELECTRONIC DEVICE AND METHOD FOR MANUFACTURING THE PRINTED WIRING BOARD

BACKGROUND OF THE INVENTION

Field of the Invention

The present invention relates to a copper heat dissipation material, a carrier-attached copper foil, a terminal, a laminate, a shield material, a printed-wiring board, a metal processed member, an electronic device and a method for manufacturing the printed wiring board.

Description of the Related Art

Recently, with the tendency toward miniaturization and high-definition of electronic devices, it has been concerned that the electronic devices break down with heat generated by the electronic components used therein. In particular, in electronic components used in electric cars and hybrid electric cars, which experience remarkable growth, there are components, such as connectors in the battery portion, through which significantly high current flows, and heat generated from the electronic components during current supply has been a matter of concern. In the meantime, in liquid crystals of smart phone tablets and tablets PC, a heat dissipation board called a liquid crystal frame. is used. The heat dissipation board dissipates heat from e.g., liquid crystal components and IC chips arranged around the board outside and suppresses break down of electronic components.

CITATION LIST

Patent Literature

Patent Literature 1: Japanese Patent Laid-Open No. 07-094644
Patent Literature 2: Japanese Patent Laid-Open No. 08-078461

SUMMARY OF THE INVENTION

Due to the recent tendency of electronic devices described above, liquid crystal frames conventionally used, however, have failed to satisfy the function of dissipating heat from e.g., liquid crystal components and IC chips, such as transition heat, radiation heat and convection heat, outside so as not accumulate heat inside.

Then, an object of the present invention is to provide a copper heat dissipation material having satisfactory heat dissipation performance.

The present inventors intensively conducted studies. As a result, they found that a copper heat dissipation material having a satisfactory heat dissipation performance can be provided by forming a surface alloy layer containing a predetermined metal, simultaneously with controlling the surface to have a predetermined surface roughness Sz.

The present invention was accomplished based on the above finding. According to an aspect of the invention, there is provided a copper heat dissipation material having an alloy layer containing at least one metal selected from Cu, Co, Ni, W, P, Zn, Cr, Fe, Sn and No on one or both surfaces, in which surface roughness Sz of the one or both surfaces, measured by a laser microscope using laser light of 405 nm in wavelength, is 5 μm or more.

In an embodiment of the copper heat dissipation material of the invention, the surface roughness Sz of the one or both surfaces, measured by a laser microscope using laser light of 405 nm in wavelength, is 7 μm or more.

In another embodiment of the copper heat dissipation material of the invention, the surface roughness Sz of the one or both surfaces, measured by a laser microscope using laser light of 405 nm in wavelength, is 10 μm or more.

In another embodiment of the copper heat dissipation material of the invention, the surface roughness Sz of the one or both surfaces, measured by a laser microscope using laser light of 405 nm in wavelength, is 14 μm or more.

In another embodiment of the copper heat dissipation material of the invention, the surface roughness Sz of the one or both surfaces, measured by a laser microscope using laser light of 405 nm in wavelength, is 90 μm or less.

In another embodiment of the copper heat dissipation material of the invention, the surface roughness Sa of the one or both surfaces, measured by a laser microscope using laser light of 405 nm in wavelength, is 0.13 μm or more.

In another embodiment of the copper heat dissipation material of the invention, the surface roughness Sku of the one or both surfaces, measured by a laser microscope using laser light of 405 nm in wavelength, is 6 or more.

In another embodiment of the copper heat dissipation material of the invention, a surface area ratio A/B of surface area A of the one or both surfaces to planarly viewed area B, measured by a laser microscope using laser light of 405 nm in wavelength, is 1.35 or more.

In another embodiment of the copper heat dissipation material of the invention, color difference $\Delta L$ of the one or both surfaces based on JISZ8730 satisfies $\Delta L \le -35$.

In another embodiment of the copper heat dissipation material of the invention, color difference $\Delta a$ of the one or both surfaces based on JISZ8730 satisfies $\Delta a \le 15$ In another embodiment of the copper heat dissipation material of the invention, color difference $\Delta b$ of the one or both surfaces based on JISZ8730 satisfies $\Delta b \le 17$.

In another embodiment of the copper heat dissipation material of the invention, the radiation factor of the one or both surfaces is 0.092 or more.

In another embodiment, the copper heat dissipation material of the invention comprises a resin layer on the one or both surfaces.

In another embodiment of the copper heat dissipation material of the invention, the resin layer contains a dielectric substance.

According to another aspect of the present invention, there is provided a carrier-attached copper foil having an intermediate layer and an ultra-thin copper layer in this order on one or both surfaces of the carrier, in which the ultra-thin copper layer is the copper heat dissipation material of the invention.

In one embodiment, the carrier-attached copper foil of the invention has the intermediate layer and the ultra-thin copper layer in this order on one of the surfaces of the carrier and a roughened layer on the other surface of the carrier.

According to another aspect of the present invention, there is provided a connector using the copper heat dissipation material of the invention.

According to another aspect of the present invention, there is provided a terminal using the copper heat dissipation material of the invention.

According to another aspect of the present invention, there is provided a laminate manufactured by laminating the copper heat dissipation material of the invention or the carrier-attached copper foil of the invention; an optional pressure-sensitive adhesive layer or adhesive layer; and a resin substrate, a substrate, a chassis, a metal processed member, an electronic component, an electronic device, a liquid crystal panel, a display or a separator in this order.

According to another aspect of the present invention, there is provided a shield material having the laminate of the invention.

According to another aspect of the present invention, there is provided a printed-wiring board having the laminate of the invention.

According to another aspect of the present invention, there is provided a metal processed member using the copper heat dissipation material of the invention or the carrier-attached copper foil of the invention.

According to another aspect of the present invention, there is provided an electronic device using the copper heat dissipation material of the invention or the carrier-attached copper foil of the invention.

According to another aspect of the present invention, there is provided a method for manufacturing a printed wiring board, including a step of preparing the carrier-attached copper foil of the invention and an insulating substrate, a step of laminating the carrier-attached copper foil and the insulating substrate, a step of forming a metal-clad laminate by detaching carrier from the carrier-attached copper foil after the carrier-attached copper foil and the insulating substrate are laminated, and thereafter, a step of forming a circuit by any one of a semi-additive method, a subtractive method, a partly additive method and a modified semi-additive method.

According to another aspect of the present invention, there is provided a method for manufacturing a printed wiring board, including a step of forming a circuit on the surface of the ultra-thin copper layer of the carrier-attached copper foil according to according to the present invention or the surface of the carrier, a step of forming a resin layer on the surface of the ultra-thin copper layer of the carrier-attached copper foil or the surface of the carrier so as to bury the circuit, a step of forming a circuit on the resin layer a step of detaching the carrier or the ultra-thin copper layer after the circuit is formed on the resin layer, and a step of exposing the circuit buried in the resin layer and formed on the surface of the ultra-thin copper layer or the surface of the carrier by removing the ultra-thin copper layer or the carrier after the carrier or the ultra-thin copper layer is detached.

According to the present invention, it is possible to provide a copper heat dissipation material having a satisfactory heat dissipation performance.

DETAILED DESCRIPTION OF THE PREFERRED EMBODIMENTS

Figure 1:
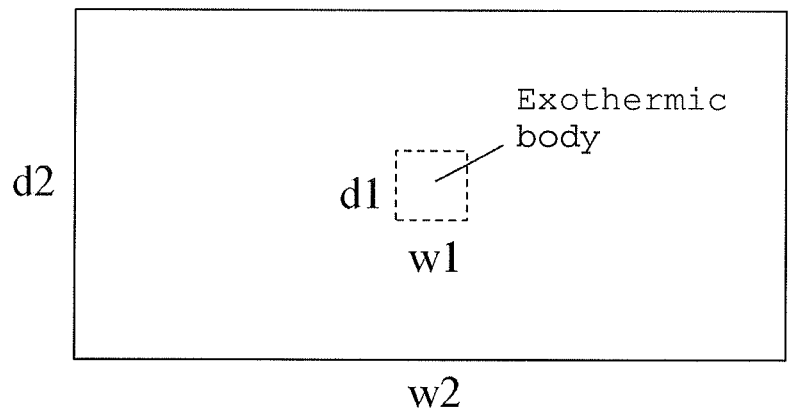
FIG. 1 is a schematic view of a sample according to Example as viewed from the above.
Figure 2:
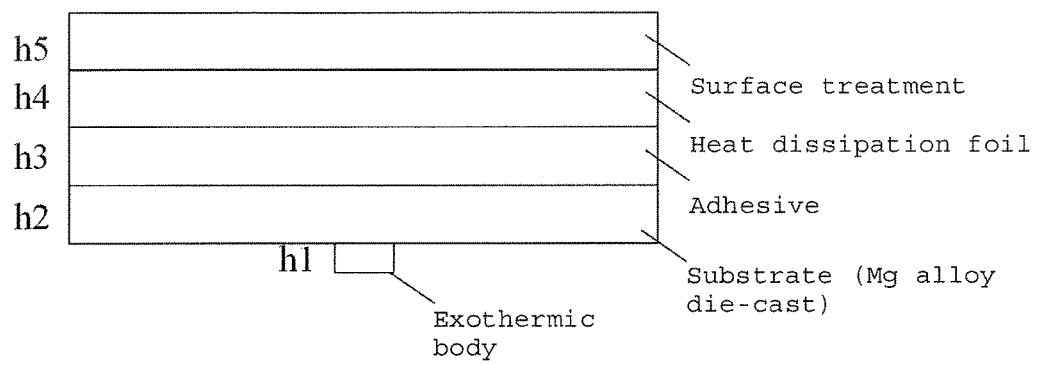
FIG. 2 is schematic cross-sectional view the sample according to Example.

[Configuration of Copper Heat Dissipation Material and Production Method]

As the copper heat dissipation material to be used in the present invention, copper or a copper alloy can be used.

As copper, copper having a purity of 95 mass % or more, and more preferably 99.90 mass % or more is mentioned. Typical examples thereof include phosphorus deoxidized copper (JIS H3100, Alloy Nos. C1201, C1220, C1221) defined in JIS H0500 and JIS H3100; oxygen-free copper (JIS H3100, Alloy No. C1020); tough pitch copper (JIS H3100, Alloy No. C1100); and electrolytic copper foil. Alternatively, copper or a copper alloy containing at least one of Sn, Ag, Au, Co, Cr, Fe, In, Ni, P, Si, Te, Ti, Zn, B, Mn and Zr in a total amount of 0.001 to 4.0 mass % can be used.

Examples of the copper alloy further include phosphor bronze, Corson alloy, red brass, brass, nickel silver and other copper alloys. Alternatively, copper or copper alloys defined in JIS H 3100 to JIS H3510, JIS H 5120, JIS H 5121, JIS C 2520 to JIS C 2801 and JIS E 2101 to JIS E 2102 can be used in the present invention. Note that, in the specification, unless otherwise specified, JIS standards mentioned above to indicate the standard of metals are those listed in 2001 JIS standard.

Phosphor bronze typically refers to a copper alloy containing copper as a main component and Sn and P (smaller than S in mass). As an example of the composition of phosphor bronze, a composition having Sn (3.5 to 11 mass %), P (0.03 to 0.35 mass %) and the remainder consisting of copper and unavoidable impurities is mentioned. The phosphor bronze may contain elements such as Ni and Zn in a total amount of 1.0 mass % or less.

Corson alloy refers to a copper alloy typically produced by adding an element (e.g., at least one element of Ni, Co and Cr) which forms a compound with Si and precipitates in the mother phase as a second phase particle. As an example of the composition of Corson alloy, a composition having at least one of Ni, Co and Cr (0.5 to 4.0 mass % in total), Si (0.1 to 1.3 mass %) and the remainder consisting of copper and unavoidable impurities is mentioned. As another example of the composition of Corson alloy, a composition having either one of Ni and Co (0.5 to 4.0 mass % in total), Si (0.1 to 1.3 mass %), Cr (0.03 to 0.5 mass %), and the remainder consisting of copper and unavoidable impurities is mentioned. As another example of the composition of Corson alloy, a composition having Ni (0.5 to 4.0 mass %), Si (0.1 to 1.3 mass %), Co (0.5 to 2.5 mass %) and the remainder consisting of copper and unavoidable impurities is mentioned. As another example of the composition of Corson alloy, a composition having Ni (0.5 to 4.0 mass %), Si (0.1 to 1.3 mass %), Co (0.5 to 2.5 mass %), Cr (0.03 to 0.5 mass %) and the remainder consisting of copper and unavoidable impurities is mentioned. As another examples of the composition of Corson alloy, a composition having Si (0.2 to 1.3 mass %), Co (0.5 to 2.5 mass %) and the remainder consisting of copper and unavoidable impurities is mentioned. To the Corson alloys, other elements (for example, Mg, Sn, B, Ti, Mn, Ag, P, Zn, As, Sb, Be, Zr, Al and Fe) may be optionally added. These other optional elements are generally added in a total amount up to about 5.0 mass %. As a further another example of the composition of Corson alloy, a composition having at least one of Ni, Co and Cr (0.5 to 4.0 mass % in total), Si (0.1 to 1.3 mass %), Sn (0.01 to 2.0 mass %), Zn (0.01 to 2.0 mass %) and the remainder consisting of copper and unavoidable impurities is mentioned.

In the present invention, red brass refers to an alloy of copper and zinc containing zinc (1 to 20 mass %) and more preferably zinc (1-10 mass %). Furthermore, the red brass may contain tin (0.1 to 1.0 mass %).

In the present invention, brass refers to an alloy of copper and zinc, more specifically a copper alloy containing zinc (20 mass % or more). The upper limit of zinc, although it is not particularly limited, is 60 mass % or less, preferably 45 mass % or less or 40 mass % or less.

In the present invention, nickel silver refers to a copper alloy containing copper (60 mass % to 75 mass %) as a main component, nickel (8.5 mass % to 19.5 mass %) and zinc (10 mass % to 30 mass %).

In the present invention, other copper alloys refer to those containing one or two or more elements of Zn, Sn, Ni, Mg, Fe, Si, P, Co, Mn, Zr, Ag, B, Cr and Ti (8.0% or less in total) and the remainder consisting of unavoidable impurities and copper.

Note that, the heat dissipation material of the present invention can be prepared by using a metal having a satisfactory heat conductivity such as aluminum, an aluminum alloy, nickel, a nickel alloy, magnesium, a magnesium alloy, silver, a silver alloy, gold, a gold alloy, a precious metal or an alloy containing a precious metal in place of copper or a copper alloy to be used as the copper heat dissipation material. Note that the metal to be used in the copper heat dissipation material and heat dissipation material preferably has a heat conductivity of 32 W/(m·K) or more.

The configuration of the copper heat dissipation material to be used in the present invention, although it is not particularly limited, may be a processed shape into the final electronic component or a partially processed by pressing. Alternatively, the copper heat dissipation material may not be processed into a shape and may have sheet, plate, strip, foil, rod, line, and box and a three-dimensional shape (cuboid, cube, polyhedron, triangular pyramid, column, cylinder, cone, sphere, roughened three-dimensional body, a three-dimensional body having a flat and/or curved surface). Furthermore, the copper heat dissipation material is preferably a rolled copper foil or an electrolytic copper foil and more preferably a rolled copper foil. Note that the "copper foil" is defined to include a copper-alloy foil.

The thickness of the copper heat dissipation material that can be used, although it is not particularly limited, for example, may be appropriately controlled so as to have a suitable thickness depending upon the use, for example, about 1 to 5000 μm or about 2 to 1000 μm can be employed. More specifically, if the copper heat dissipation material to which a circuit is formed and put in use, the thickness thereof is 35 μm or less, and if the copper heat dissipation material is used as a shield tape as a shield material, the thickness of the copper heat dissipation material may be as thin as 18 μm or less. If the copper heat dissipation material is used as a connector within an electronic device and as a shield material other than a shield tape, as a terminal and a cover, the copper heat dissipation material may have a thickness as high as 70 to 1000 μm. Thus, the upper limit thickness is not particularly specified. Note that the shield material may be subjected alone to shield use or may be constituted in combination with other components and subjected to shield use as a shield component.

In the copper heat dissipation material of the invention, a surface roughness Sz (the maximum height of the surface) of one or both surfaces thereof, which is measured by a laser microscope using laser light of 405 nm in wavelength, is 5 μm or more. If surface roughness Sz (of one or both surfaces of the copper heat dissipation material) is less than 5 μm, heat is not sufficiently dissipated from the exothermic body. The surface roughness Sz (of one or both surfaces of a copper heat dissipation material) is preferably 7 μm or more, more preferably 10 μm or more, further more preferably 14 μm or more, further more preferably 15 μm or more and further more preferably 25 μm or more. The upper limit, although it is not particularly limited, may be, for example, 90 μm or less, 80 μm or less or 70 μm or less. If the surface roughness Sz exceeds 90 μm, productivity may sometimes decrease.

The "surface" of the copper heat dissipation material herein basically refers to the surface of the alloy layer of the copper heat dissipation material. If a surface treated layer such as a heat-resistant layer, a rustproofing layer, a chromate treated layer and a layer treated with a silane coupling agent is provided to the surface of the copper heat dissipation material, the "surface" of the copper heat dissipation material refers to the outermost surface of the surface treated layer.

In the copper heat dissipation material of the invention, a surface roughness Sa (arithmetic average surface-roughness) of one or both surfaces thereof is preferably 0.13 μm or more. If the surface roughness Sa of one or both surfaces of the copper heat dissipation material is less than 0.13 μm, performance of dissipating heat from an exothermic body may decrease. The surface roughness Sa (of one or both surfaces of the copper heat dissipation material) is more preferably 0.20 μm or more, further more preferably 0.25 μm or more, further more preferably 0.30 μm or more, typically 0.1 to 1.0 μm and more typically 0.1 to 0.9 μm.

In the copper heat dissipation material of the invention, a surface roughness Sku (peakedness of surface height distribution, i.e., kurtosis) of one or both surfaces thereof is preferably 6 or more. If Sku (of one or both surfaces thereof) is less than 6, performance of dissipating heat from an exothermic body may decrease. Sku (of one or both surfaces thereof) is more preferably 9 or more, further more preferably 10 or more, further more preferably 40 or more, further more preferably 60 or more, typically 3 to 200 and more typically 4 to 180.

In the copper heat dissipation material of the invention, a surface area ratio A/B, which is the ratio of surface area A of the one or both surfaces to planarly viewed area B, measured by a laser microscope using laser light of 405 nm in wavelength, is preferably 1.35 or more. If the surface area ratio A/B (of one or both surfaces) is less than 1.35, the performance of dissipating heat from an exothermic body may decrease. The surface area ratio A/B is more preferably 1.36 or more, further more preferably 1.38 or more, further more preferably 1.40 or more, further more preferably 1.45 or more, typically 1.00 to 8.00 and more typically 1.10 to 7.50.

In the copper heat dissipation material of the invention, the radiation factor of one or both surfaces is preferably 0.092 or more. If the radiation factor (of one or both surfaces of the copper heat dissipation material) is 0.092 or more, heat from an exothermic body can be satisfactorily dissipated. The radiation factor (of one or both surfaces of the copper heat dissipation material) is more preferably 0.10 or more, further more preferably 0.123 or more, further more preferably 0.154 or more, further more preferably 0.185 or more and further more preferably 0.246 or more.

In the copper heat dissipation material of the invention, the upper limit of the radiation factor (of one or both surfaces), although it is not necessarily defined, is typically 1 or less, more typically 0.99 or less, more typically 0.95 or less, more typically 0.90 or less, more typically 0.85 or less and more typically 0.80 or less. Note that if the radiation factor (of one or both surfaces of the copper heat dissipation material) is 0.90 or less, productivity is improved.

In the copper heat dissipation material of the invention, color difference $\Delta L$ of one or both surfaces, which is color difference based on the object color of a white plate (when D65 is used as a light source and a field of view is set to have a viewing angle of 10°, the tristimulus values of the $X_{10}Y_{10}Z_{10}$ color system (JIS 28701 1999) of the white plate are $X_{10}=80.7$, $Y_{10}=85.6$, $Z_{10}=91.5$ and the object color of the white plate in the $L^*a^*b^*$ color system is expressed by $L^*=94.14$, $a^*=-0.90$, $b^*=0.24$) as a reference color; in other words, color difference $\Delta L$ defined in JISZ8730 (difference of CIE luminosity $L^*$ between colors of two objects in the $L^*a^*b^*$ color system defined in JIS Z8729 (2004)), preferably satisfies $\Delta L \leq -35$. Likewise, if the color difference $\Delta L$ of the surface of a copper heat dissipation material satisfies $\Delta L \leq -35$, heat from an exothermic body, such as conductive heat, radiant heat and convection heat, can be satisfactorily absorbed and dissipated. Surface color difference $\Delta L$ more preferably satisfies $\Delta L \leq -40$, further more preferably $\Delta L \leq -45$, further more preferably $\Delta L \leq -50$, further more preferably $\Delta L \leq -60$, further more preferably $\Delta L \leq -70$, and typically $-90 \leq \Delta L \leq -5$, $-90 \leq \Delta L \leq -10$, $-88 \leq \Delta L \leq -35$, or $-85 \leq \Delta L \leq -35$.

In the copper heat dissipation material of the invention, color difference $\Delta a$ of one or both surfaces, which is color difference based on the object color of a white plate (when D65 is used as a light source and a field of view is set to have a viewing angle of 10°, the tristimulus values of the $X_{10}Y_{10}Z_{10}$ color system (JIS 28701 1999) of the white plate are $X_{10}=80.7$, $Y_{10}=85.6$, $X_{10}=91.5$ and the object color of the white plate of the $L^*a^*b^*$ color system is expressed by $L^*=94.14$, $a^*=-0.90$, $b^*=0.24$) as a reference color; in other words, color difference $\Delta a$ defined in JISZ8730 (difference of color coordinate, $a^*$ between colors of two objects in the $L^*a^*b^*$ color system defined in JIS 28729 (2004)), preferably satisfies $\Delta a \leq 15$. Likewise, if the color difference $\Delta a$ of the surface of a copper heat dissipation material satisfies $\Delta a \leq 15$, heat from an exothermic body, such as conductive heat, radiant heat and convection heat, can be satisfactorily absorbed. The surface color difference $\Delta a$ is more preferably $\Delta a \leq 10$, further more preferably $\Delta a \leq 5$, further more preferably $\Delta a \leq 4$, typically $-10 \leq \Delta a \leq 15$ and more typically $-8 \leq \Delta a \leq 15$.

In the copper heat dissipation material of the invention, color difference $\Delta b$ of one or both surfaces, which is color difference based on the object color of a white plate (when D65 is used as a light source and a field of view is set to have a viewing angle of 10°, the tristimulus values of the $X_{10}Y_{10}Z_{10}$ color system (JIS 28701 1999) of the white plate are $X_{10}=80.7$, $Y_{10}=85.6$, $Z_{10}=91.5$ and the object color of the white plate of the $L^*a^*b^*$ color system is expressed by $L^*=94.14$, $a^*=-0.90$, $b^*=0.24$) as a reference color; in other words, color difference $\Delta b$ defined in JISZ8730 (difference of color coordinate, $b^*$ between colors of two objects in the $L^*a^*b^*$ color system defined in JIS 28729 (2004)), preferably satisfies $\Delta b \leq 17$. Likewise, if the color difference $\Delta b$ of the surface of a copper heat dissipation material satisfies $\Delta b \leq 17$, heat from an exothermic body, such as conductive heat, radiant heat and convection heat, can be satisfactorily absorbed. The surface color difference $\Delta b$ is more preferably $\Delta b \leq 15$, further more preferably $\Delta b \leq 5$, further more preferably $\Delta b \leq 3$, typically $-15 \leq \Delta b \leq 17$ and more typically $-10 \leq \Delta b \leq 17$.

In the copper heat dissipation material of the invention, color difference $\Delta E^*ab$ of one or both surfaces, which is color difference based on the object color of a white plate (when D65 is used as a light source and a field of view is set to have a viewing angle of 10°, the tristimulus values of the $X_{10}Y_{10}Z_{10}$ color system (JIS 28701 1999) of the white plate are $X_{10}=80.7$, $Y_{10}=85.6$, $Z_{10}=91.5$ and the object color of the white plate of the $L^*a^*b^*$ color system is expressed by $L^*=94.14$, $a^*=-0.90$, $b^*=0.24$) as a reference color; in other words, color difference $\Delta E^*ab$ defined in JISZ8730 preferably satisfies $47 \leq \Delta E^*ab$. Likewise, if the color difference $\Delta E^*ab$ of the surface of a copper heat dissipation material satisfies $47 \leq \Delta E^*ab$, heat from an exothermic body, such as conductive heat, radiant heat and convection heat, can be satisfactorily absorbed. The surface color difference $\Delta E^*ab$ is more preferably $50 \leq \Delta E^*ab$, further more preferably $55 \leq \Delta E^*ab$, further more preferably $60 \leq \Delta E^*ab$, further more preferably $71 \leq \Delta E^*ab$, typically $47 \leq \Delta E^*ab \leq 90$, more typically $47 \leq \Delta E^*ab \leq 88$ and more typically $47 \leq \Delta E^*ab \leq 85$.

Color differences $\Delta L$, $\Delta a$ and $\Delta b$, each of which are measured by a color-difference meter, are general indexes represented by the $L^*a^*b^*$ color system based on JIS Z8730(2009) in consideration of further black/white/red/green/yellow/blue and $\Delta L$ represents black-white color difference, $\Delta a$ red-green color difference and $\Delta b$ Yellow Blue color difference. $\Delta E^*ab$ is represented by the following expression using these color differences. The color differences ($\Delta L$, $\Delta a$, $\Delta b$) can be measured by use of a color difference meter, MiniScan XE Plus manufactured by HunterLab.

$$\Delta E^*ab = \sqrt{\Delta L^2 + \Delta a^2 + \Delta b^2} \qquad \text{Expression 1}$$

The copper heat dissipation material of the invention has an alloy layer containing at least one metal selected from Cu, Co, Ni, W, P, Zn, Cr, Fe, Sn and Mo on one or both surfaces. With such a configuration, the aforementioned color difference and surface roughness can be controlled. If color difference is controlled, heat from an exothermic body, such as conductive heat, radiant heat and convection heat, can be satisfactorily absorbed. Note that the alloy layer can be formed by wet plating such as electroplating, non-electrolytic plating and immersion plating; sputtering; or dry plating such as CVD and PDV. In view of cost, electroplating is preferable.

The alloy layer of the copper heat dissipation material of the invention can be formed, for example, in the following plating conditions alone or in combination and by controlling the number of treatment operations. Note that the remainder of the treatment liquid to be used in desmear treatment, electrolytic, surface treatment or plating is water unless otherwise specified.

Plating condition 1 for forming alloy layer 1: Cu layer
Plating liquid composition: Cu concentration 5 to 20 g/L
PH: 1.0 to 5.0
Temperature: 25 to 55° C.
Current density: 2 to 70 A/dm$^2$
Plating time: 0.2 to 20 seconds
Plating condition 2 for forming alloy layer: Cu—Co—Ni layer
Plating liquid composition: Cu concentration 10 to 20 g/L, Co concentration 5 to 10 g/L, Ni concentration 5 to 10 g/L
PH: 2.0 to 6.0
Temperature: 25 to 55° C.
Current density: 10 to 60 A/dm$^2$
Plating time: 0.3 to 10 seconds Plating condition 3 for forming alloy layer: Cu—Co—Ni—P layer
Plating liquid composition: Cu concentration 10 to 20 g/L, Co concentration 5 to 10 g/L, Ni concentration 5 to 10 g/L, P concentration 10 to 800 mg/L
PH: 2.0 to 6.0
Temperature: 25 to 55° C.
Current density: 10 to 60 A/dm$^2$
Plating time: 0.3 to 10 seconds
Plating condition 4 for forming alloy layer: Ni—Zn layer
Plating liquid composition: Ni concentration 10 to 60 g/L, Zn concentration 5 to 30 g/L
PH: 3.5 to 6.0
Temperature: 25 to 55° C.
Current density: 0.2 to 3.0 A/dm$^2$
Plating time: 4 to 181 seconds
Plating condition 5 for forming alloy layer: Cu—Ni—P layer
Plating liquid composition: Cu concentration 5 to 15 g/L, Ni concentration 10 to 30 g/L, P concentration 10 to 800 m g/L
PH: 2.0 to 5.0
Temperature: 25 to 55° C.
Current density: 10 to 60 A/dm$^2$
Plating time: 0.2 to 10 seconds
when an alloy layer is formed in Plating conditions 1 to 3 and 5, it is necessary to perform a surface treatment a plurality of times.
Plating condition 6 for forming alloy layer: Cr—Zn layer
Plating liquid composition: Cr concentration 2 to 8 g/L, Zn concentration 0.1 to 1.0 g/L
PH: 2.0 to 4.0
Temperature: 40 to 60° C.
Current density: 0.5 to 3.0 A/dm$^2$
Plating time: 0.2 to 10 seconds
Plating condition 7 for forming alloy layer: Cu—Ni—W layer
Plating liquid composition: Cu concentration 5 to 15 g/L, Ni concentration 10 to 40 g/L, W concentration 10 to 1000 m g/L
PH: 2.0 to 4.0
Temperature: 40 to 60° C.
Current density: 10 to 60 A/dm$^2$
Plating time: 0.2 to 10 seconds
Plating condition 8 for forming alloy layer: Ni—W—Sn layer
Plating liquid composition: Ni concentration 10 to 50 g/L, W concentration 300 to 3000 m g/L, Sn concentration 100 to 1000 m g/L
PH: 3.0 to 6.5
Temperature: 40 to 60° C.
Current density: 0.1 to 4.0 A/dm$^2$
Plating time: 10-60 seconds
Plating condition 9 for forming alloy layer: Cu—Ni—Mo—Fe layer
Plating liquid composition: Cu concentration 5 to 15 g/L, Ni concentration 10 to 40 g/L, No concentration 50 to 5000 m g/L, Fe concentration 0.5 to 5.0 g/L
PH: 2.0 to 5.0
Temperature: 40 to 60° C.
Current density: 10 to 60 A/dm$^2$
Plating time: 5-30 seconds
Note that additives known in the art may be used in the plating liquid for forming an alloy layer. For example, an additive accelerating precipitation of metal ions, an additive for stabilizing metal ions in a plating liquid, an additive permitting metal ions to uniformly precipitate, and a labelling agent and a glazing agent may be used.

As the additive, for example, chlorine, bis(3-sulfopropyl) disulfide, an amine compound, glue, cellulose, ethylene glycol, thiourea, a sulfide and an organic sulfur compound. As the concentration of the additive, a concentration usually used is preferable. If the additive is added, the color tone and unevenness of a surface can be controlled.

When the alloy layer is used, the total amount deposited of at least one metal selected from Co, Ni, W, P, Zn, Cr, Fe, Sn and Mo and contained in the alloy layer is preferably 0.1 to 100000 μg/dm$^2$, preferably, 5 to 80000 μg/dm$^2$, preferably 10 to 85000 μg/dm$^2$, and preferably 100 to 80000 μg/dm$^2$. If the total amount deposited is lower than 0.1 μg/dm$^2$, the effect of the alloy layer provided may be low. In contrast, if the total amount deposited exceeds 100000 μg/dm$^2$, productivity may reduce. When a circuit is formed in the copper heat dissipation material and a high-frequency signal is sent by use of the circuit, the upper limit of the amount deposited of Ni contained in the alloy layer can be preferably 4000 μg/dm$^2$ or less, more preferably 3000 μg/dm$^2$ or less, more preferably 1400 μg/dm$^2$ or less and more preferably 1000 μg/dm$^2$ or less. The lower limit of the amount deposited of Ni can be typically 50 μg/dm$^2$ or more, more preferably 100 μg/dm$^2$ and more preferably 300 μg/dm$^2$ or more. In short, the amount deposited of Ni contained in the alloy layer is typically 50 μg/dm$^2$ or more and 4000 μg/dm$^2$ or less.

In the case where a circuit is formed in the copper heat dissipation material and a high-frequency signal is sent by use of the circuit, the upper limits of the amounts deposited of Co, Fe and Mo contained in the above alloy layer each are preferably 6000 μg/dm$^2$ or less, more preferably 5000 μg/dm$^2$ or less, more preferably 3000 μg/dm$^2$ or less, more preferably 2400 μg/dm$^2$ or less and more preferably 2000 μg/dm$^2$ or less. The lower limit of the amount deposited of Co can be typically 50 μg/dm$^2$ or more, more preferably 100 μg/dm$^2$ and more preferably 300 μg/dm$^2$ or more. In other words, the amount deposited of Co contained in the alloy layer is typically 50 μg/dm$^2$ or more and 6000 μg/dm$^2$ or less. In the case where the above alloy layer has a layer containing Co and/or Ni other than the Cu—Co—Ni alloy plating layer, the total amount deposited of Ni and the total amount deposited of Co in the whole alloy layer can be set to fall within the aforementioned range.

When Cu is contained the above alloy layer, the upper limit, although it is not particularly necessary to set, is typically 100 mg/dm$^2$ or less, more typically 90 mg/dm$^2$ or less and more typically 80 mg/dm$^2$ or less. In the case where Cu is contained in the above alloy layer, the lower limit, although it is not particularly necessary to set, is typically 0.01 μg/dm$^2$ or more, more typically 0.1 μg/dm$^2$ or more and more typically 1 μg/dm$^2$ or more, and typically 0.01 μg/dm$^2$ or more and 100 mg/dm$^2$ or less.

On the surface of copper or a copper alloy or the surface of an alloy layer to be used as a copper heat dissipation material, a surface treated layer may be provided. The surface treated layer may be a roughened layer, a heat-resistant layer, a rustproofing layer, a chromate treated layer, a layer treated with a silane coupling agent or a plated layer. The surface treated layer may be formed by forming a black resin layer on the surface of a copper heat dissipation material. More specifically, the black resin layer can be formed by impregnating e.g., an epoxy resin, with a black paint and applying the resin to a copper heat dissipation material followed by drying so as to obtain a predetermined thickness.

Surface Treated Layer

A roughened layer may be provided to the surface of copper or the copper alloy or the surface of the alloy layer to be used as a copper heat dissipation material by applying a roughening treatment to the surface in order to improve adhesion to, for example, an adhesive layer. The roughening treatment can be applied by forming roughening particles of e.g., copper or a copper alloy. The roughening particles may be small. The roughened layer may be a layer formed of an element selected from the group consisting of copper, nickel, cobalt, phosphorus, tungsten, arsenic, molybdenum, chromium and zinc or an alloy containing at least one of these. Alternatively, in the roughening treatment, roughening particles of copper or a copper alloy are formed, and then secondary particles or tertiary particles formed of e.g., nickel, cobalt, copper and zinc or an alloy of these are provided. Thereafter, a heat-resistant layer or a rustproofing layer may be formed of e.g., nickel, cobalt, copper, zinc or an alloy of these. Furthermore, the surface thereof may be treated with chromate and a silane coupling agent. Alternatively, a roughening treatment is not applied and a heat-resistant layer or a rustproofing layer is formed of, e.g., nickel, cobalt, copper and zinc or an alloy of these and the resultant surface may be treated with chromate and a silane coupling agent. In other words, to the surface of the roughened layer or alloy layer, at least one layer selected from the group consisting of a heat-resistant layer, a rustproofing layer, a chromate treated layer and a layer treated with a silane coupling agent may be formed; or at least one layer selected from the group consisting of a heat-resistant layer, a rustproofing layer, a chromate treated layer and a layer treated with a silane coupling agent may be formed on the surface of copper or a copper alloy to be used as a copper heat dissipation material. Note that the aforementioned heat-resistant layer, rustproofing layer, chromate treated layer and layer treated with a silane coupling agent are each formed of a plurality of layers (for example, two layers or more, three layers or more).

The chromate treated layer herein refers to a layer treated with a solution containing chromic anhydride, chromic acid, dichromate, chromate or dichromate. The chromate treated layer may contain an element such as cobalt, iron, nickel, molybdenum, zinc, tantalum, copper, aluminum, phosphorus, tungsten, tin, arsenic and titanium (in any form such as a metal, an alloy, an oxide, a nitride and a sulfide). Examples of the chromate treated layer include a chromate treated layer obtained by treatment with chromic anhydride or an aqueous potassium dichromate solution and a chromate treated layer obtained by treatment with a liquid containing chromic anhydride or potassium dichromate and zinc.

As the heat-resistant layer and rustproofing layer, a heat-resistant layer and a rustproofing layer known in the art can be used. For example, the heat-resistant layer and/or rustproofing layer may be a layer containing at least one element selected from the group consisting of nickel, zinc, tin, cobalt, molybdenum, copper, tungsten, phosphorus, arsenic, chromium, vanadium, titanium, aluminum, gold, silver, platinum group elements, iron and tantalum; or a metal layer or alloy layer formed of at least one element selected from the group consisting of nickel, zinc, tin, cobalt, molybdenum, copper, tungsten, phosphorus, arsenic, chromium, vanadium, titanium, aluminum, gold, silver, platinum group elements, iron and tantalum. The heat-resistant layer and/or rustproofing layer may contain an oxide, a nitride and/or a silicide containing at least one element selected from the group consisting of nickel, zinc, tin, cobalt, molybdenum, copper, tungsten, phosphorus, arsenic, chromium, vanadium, titanium, aluminum, gold, silver, platinum group elements, iron and tantalum. Alternatively, the heat-resistant layer and/or rustproofing layer contain a nickel-zinc alloy or may be a nickel-zinc alloy layer. The nickel-zinc alloy layer may contain nickel (50 wt % to 99 wt %) and zinc (50 wt % to 1 wt %) except unavoidable impurities. The total amount deposited of zinc and nickel in the nickel-zinc alloy layer may be 5 to 1000 mg/m$^2$, preferably 10 to 500 mg/m$^2$, and preferably 20 to 100 mg/m$^2$. The ratio of the amount deposited of nickel to the amount deposited of zinc, i.e., the amount deposited of nickel/the amount deposited of zinc, in the layer containing a nickel-zinc alloy or the nickel-zinc alloy layer, is preferably 1.5 to 10. The amount deposited of nickel of the layer containing a nickel-zinc alloy or the nickel-zinc alloy layer is preferably 0.5 mg/m$^2$ to 500 mg/m$^2$ and more preferably 1 mg/m$^2$ to 50 mg/m$^2$. In the case where the heat-resistant layer and/or rustproofing layer is a layer containing a nickel-zinc alloy, when the inner wall of e.g., through-holes and via-holes comes into contact with a desmear liquid, the interface between copper or a copper alloy or an alloy layer and a resin substrate is rarely eroded by the desmear liquid, with the result that adhesiveness between the copper or copper alloy or alloy layer and the resin substrate improves.

The heat-resistant layer and/or rustproofing layer may be, for example, a laminate obtained by sequentially laminating a nickel or nickel alloy layer, which has an amount deposited of 1 mg/m$^2$ to 100 mg/m$^2$, preferably 5 mg/m$^2$ to 50 mg/m$^2$, and a tin layer, which has an amount deposited of 1 mg/m$^2$ to 80 mg/m$^2$, preferably 5 mg/m$^2$ to 40 mg/m$^2$. The nickel alloy layer may be constituted of any one of nickel-molybdenum, nickel-zinc and nickel-molybdenum-cobalt. In the heat-resistant layer and/or rustproofing layer, the total amount deposited of nickel or a nickel alloy and tin is preferably 2 mg/m$^2$ to 150 mg/m$^2$ and more preferably 10 mg/m$^2$ to 70 mg/m$^2$. In the heat-resistant layer and/or rustproofing layer, [amount deposited of nickel or nickel in a nickel alloy]/[amount deposited of tin] is preferably 0.25 to 10 and more preferably 0.33 to 3. If the heat-resistant layer and/or rustproofing layer is used, when a carrier-attached copper foil is processed into a printed-wiring board, the resultant peel strength of a circuit, the degree of deterioration of chemical resistance of the peel strength, and the like are improved.

Note that as a silane coupling agent to be used in the silane coupling treatment, a silane coupling agent known in the art may be used; for example, an amino-based silane coupling agent, an epoxy-based silane coupling agent or a mercapto-based silane coupling agent may be used. Specific examples of the silane coupling agent may include vinyl trimethoxy silane, vinylphenyl trimethoxysilane, γ-methacryloxypropyltrimethoxysilane, γ-glycidoxypropyltrimethoxysilane, 4-glycidyl butyl trimethoxysilane, γ-aminopropyltriethoxysilane, N-β (aminoethyl) γ-aminopropyltrimethoxysilane, N-3-(4-(3-amino-propoxy)butoxy)propyl-3-aminopropyltrimethoxysilane, imidazole silane, triazine silane and γ-mercaptopropyltrimethoxysilane.

The layer treated with a silane coupling agent may be formed of a silane coupling agent such as an epoxy silane, amino silane, methacryloxy silane and a mercapto-based silane. Note that such silane coupling agents may be used as a mixture of two or more types. Of them, the layer treated with a silane coupling agent is preferably formed of an amino-based silane coupling agent or an epoxy-based silane coupling agent.

The amino-based silane coupling agent herein may be selected from the group consisting of N-(2-aminoethyl)-3- aminopropyltrimethoxysilane, 3-(N-styrylmethyl-2-aminoethyl amino)propyl trimethoxysilane, 3-aminopropyltriethoxysilane, bis(2-hydroxy-ethyl)-3-aminopropyltriethoxysilane, aminopropyltrimethoxysilane, N-methyl-aminopropyltrimethoxysilane, N-phenyl-aminopropyltrimethoxysilane, N-(3-acryloxy-2-hydroxypropyl)-3-aminopropyltriethoxysilane, 4-aminobutyltriethoxysilane, (aminoethylaminomethyl)phenethyl trimethoxy silane, N-(2-aminoethyl-3-aminopropyl)trimethoxysilane, N-(2-aminoethyl-3-aminopropyl)tris(2-ethylhexoxy)silane, 6-(aminohexylaminopropyl)trimethoxysilane, aminophenyltrimethoxysilane, 3-(1-amino-propoxy)-3,3-dimethyl-1-propenyltrimethoxysilane, 3-aminopropyl tris(methoxyethoxy)silane, 3-aminopropyltriethoxysilane, 3-aminopropyltrimethoxysilane, ω-amino undecyl trimethoxysilane, 3-(2-N-benzylaminoethylaminopropyl) trimethoxy silane, bis(2-hydroxyethyl)-3-aminopropyltriethoxysilane, (N,N-diethyl-3-aminopropyl)trimethoxysilane, (N,N-dimethyl-3-amino-propyl)trimethoxysilane, N-methyl-aminopropyltrimethoxysilane, N-phenyl-aminopropyltrimethoxysilane, 3-(N-styrylmethyl-2-aminoethylamino)propyltrimethoxysilane, γ-aminopropyltriethoxysilane, N-β (aminoethyl)γ-aminopropyltrimethoxysilane and N-3-(4-(3-amino-propoxy)butoxy)propyl-3-aminopropyltrimethoxysilane.

It is desirable that the layer treated with a silane coupling agent is provided so as to satisfy the range of 0.05 mg/m² to 200 mg/m², preferably 0.15 mg/m² to 20 mg/m² and preferably 0.3 mg/m² to 2.0 mg/m² in terms of silicon atom. In the above-mentioned range, adhesiveness between copper or a copper alloy, or an alloy layer to be used in a copper heat dissipation material and an adhesive layer can be improved.

To the surface of copper or the copper alloy, or the alloy layer to be used as the copper heat dissipation material, a roughened layer, a heat-resistant layer, a rustproofing layer, a layer treated with a silane coupling agent or a chromate treated layer, a surface treatment described in International Publication No. WO2008/053878, Japanese Patent Laid-Open No. 2008-111169, Japanese Patent No. 5024930, International Publication No. WO2006/028207, Japanese Patent No. 4828427, International Publication No. WO2006/134868, Japanese Patent No. 5046927, International Publication No. WO2007/105635, Japanese Patent No. 5180815, Japanese Patent Laid-Open No. 2013-19056, can be applied.

In the copper heat dissipation material of the invention, the surface of the copper substrate on which the aforementioned alloy layer is to be provided is controlled as follows. This is because the surface of the copper heat dissipation material is controlled to have predetermined Sz, Sa and Sku, ΔE*ab, ΔL, Δa, Δb and surface area ratio.

When a rolled material is used as the copper substrate, the rolled material is obtained by rolling while controlling the oil film equivalent represented by the following expression.

Oil film equivalent={(rolling oil viscosity [cSt])×(sheet passing speed [mpm]+roll peripheral speed [mpm])}/{(bite angle of the roll [rad])×(yield stress of the material [kg/mm²])}

The rolling oil viscosity [cSt] refers to the kinetic viscosity at 40° C.

More specifically, the rolled material, which is obtained by rolling while setting an oil film equivalent in the final cold rolling at 16000 to 30000, is used as the copper substrate of the present invention. This is because, if the oil film equivalent is less than 16000 and beyond 30000, the surface of the copper heat dissipation material having the aforementioned alloy layer does not satisfy the predetermined range. If the oil film equivalent is less than 16000, the value Sz sometimes becomes excessively low. In contrast, if the oil film equivalent is beyond 30000, the value Sz sometimes becomes excessively large.

In order to control the oil film equivalent to fall within the range of 16000 to 30000, a known method such as a method of using a low viscosity rolling or a method of decreasing a threading speed may be used.

Conditions for manufacturing the electrolytic copper foil that can be used in the invention of the present application are shown below.

Electrolyte Composition
  Copper: 90 to 110 g/L
  Sulfuric acid: 90 to 110 g/L
  Chlorine: 50 to 100 ppm
  Leveling agent 1 (bis(3-sulfopropyl)disulfide): 10 to 30 ppm
  Leveling agent 2 (amine compound): 10 to 30 ppm As the above amine compound, an amine compound represented by the following chemical formula can be used.

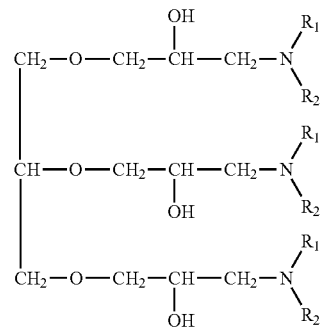

(where $R_1$ and $R_2$ each are selected from the group consisting of a hydroxyalkyl group, an ether group, an aryl group, an aromatic-substituted alkyl group, an unsaturated hydrocarbon group and an alkyl group)

Manufacturing Conditions
  Current density: 70 to 100 A/dm²
  Electrolyte temperature: 50 to 60° C.
  Electrolyte line speed: 3 to 5 m/sec
  Electrolysis time: 0.5 to 10 minutes Note that the state of the surface of copper or a copper alloy to be used in the copper heat dissipation material may be controlled by the following treatment. As the surface treatment, a roughening treatment may be applied to the surface of copper or a copper alloy. As the roughening treatment (applied to the surface of copper or a copper alloy), a surface treatment by chemical polishing and electrolytic polishing may be employed. As the treatment liquid for use in chemical polishing, a liquid usually used for etching, such as an etching solution containing sulfuric acid and hydrogen peroxide, an etching solution containing ammonium fluoride, an etching solution containing sodium persulfate, an etching solution containing ferric chloride or cupric chloride or an etching solution known in the art may be used. Alternatively, the surface of copper or a copper alloy can be roughened by electrolytic polishing, which is performed, for example, in a solution constituted of copper sulfate and an aqueous sulfuric acid solution. The electrolytic polishing is generally performed for smoothing a surface; however, electrolytic polishing is used for roughening the surface in the treatment for the surface of copper or a copper alloy used in the copper heat dissipation material of the invention. The technical idea used herein is opposite to the general one. As a method for roughening a surface by electrolytic polishing, a known technique may be employed. As the known technique of electrolytic polishing for roughening the surface, those described in Japanese Patent Laid-Open No. 2005-240132, Japanese Patent Laid-Open No. 2010-059547 and Japanese Patent Laid-Open No. 2010-047842, are mentioned. Specific conditions for roughening a surface by electrolytic polishing are, for example, as follows:

Treatment solution: Cu: 10 to 40 g/L, $H_2SO_4$: 50 to 150 g/L, temperature: 30 to 70° C.

Electrolytic polishing current: 5 to 40 A/dm$^2$

Electrolytic polishing time: 5 to 50 seconds.

As the roughening treatment for the surface of copper or a copper alloy, for example, mechanical polishing of the surface of copper or a copper alloy may be mentioned. Techniques known in the art may be used for the mechanical polishing.

Note that after the surface of copper or a copper alloy used in the copper heat dissipation material of the invention is treated, a heat-resistant layer, a rustproofing layer and a weather-resistant layer may be provided. The heat-resistant layer, rustproofing layer and weather-resistant layer may be provided by methods described above, methods described in Examples and known technical methods.

In the copper heat dissipation material of the invention, on the surface of the alloy layer of the copper heat dissipation material, further, a surface treated layer such as a roughened layer, a heat-resistant layer, a rustproofing layer and an oxide layer (the oxide layer is formed on the surface of the copper heat dissipation material by e.g., heating) may be formed. Between the copper heat dissipation material and the alloy layer, an underlying layer may be provided as long as the plating for forming the alloy layer is not damaged.

The copper heat dissipation material of the invention is bonded to a resin substrate to produce a laminate serving a shield material such as a shield tape and shield components. If necessary, the copper heat dissipation material can be further processed to form a circuit to produce, e.g., a printed-wiring board. Examples of the resin substrate that can be used for a rigid PWB (printed-wiring board) include a paper based phenol resin, a paper based epoxy resin, a synthetic fiber cloth based epoxy resin, a cloth impregnated with a fluorine resin, a glass cloth/paper composite based epoxy resin, a glass cloth/non-woven glass cloth composite based epoxy resin and a glass cloth based epoxy resin. Examples of the resin substrate that can be used for an FPC (flexible printed circuit) and tapes include a polyester film and polyimide film, a liquid crystal polymer (LCP) and a PET film. Note that in the present invention, the "printed-wiring board" is defined to include a printed-wiring board provided with components, a circuit board and a printed board. Two or more printed wiring boards of the present invention can be connected to produce a printed-wiring board. Furthermore, at least one printed wiring board of the present invention and another printed wiring board of the present invention or a printed-wiring board except the printed wiring board of the present invention may be connected and used to form electronic devices. Note that, in the present invention, the "copper circuit" is defined to include a copper wiring.

The copper heat dissipation material of the invention can be used in a heat dissipation board, a structural plate, a shield material, a shield plate, a shield component, a reinforcing material, a cover, a housing, a case and box to produce metal processed members. Since the copper heat dissipation material of the invention has satisfactory heat absorbability from an exothermic body and satisfactory dissipation of heat which the material absorbed, in other words, since the copper heat dissipation material of the invention is extremely excellent in heat dissipation, the copper heat dissipation material is particularly preferably used as a heat dissipation board. The metal processed member is defined to include a heat dissipation board, a structural plate, a shield material, a shield plate, a shield component, a reinforcing material, a cover, a housing, a cases and a box.

The metal processed members manufactured by using the copper heat dissipation material of the invention in a heat dissipation board, a structural plate, a shield material, a shield plate, a shield component, a reinforcing material, a cover, a housing, a cases and a box can be used in electronic devices.

Carrier-Attached Copper Foil

A carrier-attached copper foil according to another embodiment of the present invention has an intermediate layer and an ultra-thin copper layer laminated in this order on one or both surfaces of a carrier. The ultra-thin copper layer corresponds to the copper heat dissipation material of the aforementioned embodiment of the present invention. The "copper foil" of the carrier-attached copper foil include a copper-alloy foil.

Carrier

The carrier that can be used in the present invention is typically a metal foil or a resin film and provided in the form of e.g., a copper foil, a copper-alloy foil, a nickel foil, a nickel-alloy foil, an iron foil, an iron-alloy foil, a stainless steel foil, an aluminum foil, an aluminum-alloy foil or an insulating resin film (e.g., a polyimide film, a liquid crystal polymer (LCP) film, a polyethylene terephthalate (PET) film, a polyamide film, a polyester film, a fluororesin film).

As the carrier that can be used in the present invention copper foil, a copper foil is preferably used. This is because the copper foil has a high electrical conductivity and makes it easy to form the following intermediate layer and the ultra-thin copper layer. The carrier is typically provided in the form of a rolled copper foil and an electrolytic copper foil. The electrolytic copper foil is generally produced by electrical precipitation of copper on a drum formed of titanium and stainless steel from a copper sulfate plating bath, whereas the rolled copper foil is produced by repeating plastic working by a mill roll and heat treatment. As the material for a copper foil, not only high-purity copper such as tough pitch copper and oxygen-free copper but also a copper alloy such as Sn-containing copper, Ag-containing copper, a copper alloy containing e.g., Cr, Zr or Mg, and a Corson copper alloy containing e.g., Ni and Si can be used.

The thickness of the carrier that can be used in the present invention, although it is not particularly limited, may be controlled to be such an appropriate thickness that allows the carrier to play a role, for example, 5 μm or more. However, if the thickness is extremely large, the production cost increases. Thus, generally, the thickness of the carrier is preferably 35 μm or less. Accordingly, the thickness of the carrier is typically 12 to 70 μm and more typically 18 to 35 μm.

After surface treatment, Sz, Sa and Sku and surface area ratio A/B of the surface of the ultra-thin copper layer can be controlled by the same surface treatment as in the aforementioned copper heat dissipation material.

The electrolytic copper foil that can be manufactured by the following method can be used as a carrier.

Electrolyte Composition

Copper: 90 to 110 g/L

Sulfuric acid: 90 to 110 g/L

Chlorine: 50 to 100 ppm

Leveling agent 1 (bis(3-sulfopropyl)disulfide): 10 to 30 ppm

Leveling agent 2 (amine compound): 10 to 30 ppm

As the above amine compound, an amine compound represented by the following chemical formula can be used.

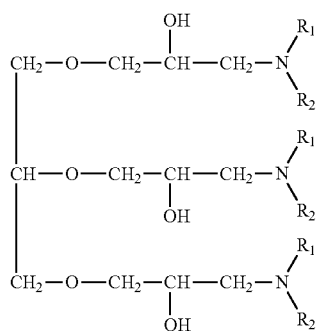

(where $R_1$ and $R_2$ each are selected from the group consisting of a hydroxyalkyl group, an ether group, an aryl group, an aromatic-substituted alkyl group, an unsaturated hydrocarbon group and an alkyl group)

Manufacturing Conditions

Current density: 70 to 100 A/dm$^2$

Electrolyte temperature: 50 to 60° C.

Electrolyte line speed: 3 to 5 m/sec

Electrolysis time: 0.5 to 10 minutes (controlled in accordance with the thickness of copper to be precipitated and current density)

Note that a roughened layer may be provided to the surface of the carrier, which is opposite to the surface on which an ultra-thin copper layer is to be provided. The roughened layer may be provided by a method known in the art or by the aforementioned roughening treatment. Providing the roughened layer onto the surface of the carrier opposite to the surface on which an ultra-thin copper layer to be provided, has an advantage: when the carrier is laminated on a support such as a resin substrate from the side of the surface having the roughened layer, the carrier and the resin substrate are hardly detached.

Intermediate Layer

An intermediate layer is provided on the carrier. Another layer may be provided between the carrier and the intermediate layer. The intermediate layer to be used in the invention is not particularly limited as long as the ultra-thin copper layer is not easily detached from the carrier until a carrier-attached copper foil is laminated on an insulating substrate; whereas the ultra-thin copper layer is easily detached from the carrier after the carrier-attached copper foil is laminated on an insulating substrate. The intermediate layer of the carrier-attached copper foil of the invention may contain, for example, at least one element selected from the group consisting of Cr, Ni, Co, Fe, Mo, Ti, W, P, Cu, Al, Zn, an alloy thereof, a hydrate thereof, an oxide thereof and an organic compound. Furthermore, the intermediate layer may be formed of a plurality of layers.

For example, the intermediate layer can be constituted by forming a single metal layer formed of a single element selected from the group consisting of Cr, Ni, Co, Fe, Mo, Ti, W, P, Cu, Al and Zn or forming an alloy layer formed of at least one element selected from the group consisting of Cr, Ni, Co, Fe, Mo, Ti, W, P, Cu, Al and Zn, on the carrier; and then, on the resultant structure, forming a layer formed of a hydrate or an oxide of at least one element selected from the group consisting of Cr, Ni, Co, Fe, Mo, Ti, W, P, Cu, Al and Zn or a layer formed of an organic compound.

Alternatively, the intermediate layer can be constituted by forming a single metal layer formed of a single element selected from the group consisting of Cr, Ni, Co, Fe, Mo, Ti, W, P, Cu, Al and Zn or an alloy layer formed of at least one element selected from the group consisting of Cr, Ni, Co, Fe, Mo, Ti, W, P, Cu, Al and Zn, on the carrier, and then, on the resultant structure, forming a single metal layer formed of an element selected from the group consisting of Cr, Ni, Co, Fe, Mo, Ti, W, P, Cu, Al and Zn or an alloy layer formed of at least one element selected from the group consisting of Cr, Ni, Co, Fe, Mo, Ti, W, P, Cu, Al and Zn.

As the organic substance, a known organic substance can be used in the intermediate layer. Preferably, at least any one of a nitrogen-containing organic compound, a sulfur-containing organic compound and a carboxylic acid, is used. Specific examples of the nitrogen-containing organic compound that is preferably used include triazole compounds having a substituent, such as 1,2,3-benzotriazole, carboxybenzotriazole, N',N'-bis(benzotriazolylmethyl)urea, 1H-1,2,4-triazole and 3-amino-1H-1,2,4-triazole.

Examples of the sulfur-containing organic compound that is preferably used include mercaptobenzothiazole, 2-mercaptobenzothiazole sodium, thiocyanuric acid and 2-benzimidazole thiol.

As the carboxylic acid, particularly a monocarboxylic acid is preferably used. Of them, oleic acid, linoleic acid and linolenic acid are preferably used.

The intermediate layer can be formed, for example, by laminating, on the carrier, a nickel layer, a nickel-phosphorus alloy layer or a nickel-cobalt alloy layer and a chromium-containing layer in this order. Since the adhesive force between nickel and copper is higher than that between chromium and copper, when an ultra-thin copper layer is detached, the ultra-thin copper layer can be detached at the interface between the ultra-thin copper layer and the chromium-containing layer. The nickel contained in the intermediate layer is expected to exert a barrier effect, i.e., an effect of preventing diffusion of a copper component from the carrier to the ultra-thin copper layer. The amount deposited of nickel of the intermediate layer is preferably 100 µg/dm$^2$ or more and 40000 µg/dm$^2$ or less, more preferably 100 µg/dm$^2$ or more and 4000 µg/dm$^2$ or less, more preferably 100 µg/dm$^2$ or more and 2500 µg/dm$^2$ or less, and more preferably 100 µg/dm$^2$ or more and less than 1000 µg/dm$^2$. The amount deposited of chromium of the intermediate layer is preferably 5 µg/dm$^2$ or more and 100 µg/dm$^2$ or less. In the case where the intermediate layer is provided only one of the surfaces of a carrier, a rustproofing layer such as a Ni plated layer is preferably provided on the opposite surface of the carrier. The chromium layer of the intermediate layer can be formed by chromium plating and treatment with a chromate.

If the thickness of the intermediate layer is extremely large, Sz, Sa and Sku and surface area ratio A/B of the ultra-thin copper layer after surface treatment may be affected by the thickness of the intermediate layer. The thickness of the intermediate layer on the surface of the surface treated layer of the ultra-thin copper layer is preferably 1 to 1000 nm, preferably 1 to 500 nm, preferably 2 to 200 nm, preferably 2 to 100 nm and more preferably 3 to 60 nm. Note that the intermediate layer may be provided to both surfaces of the carrier.

Ultra-Thin Copper Layer

The ultra-thin copper layer is provided on the intermediate layer. Another layer may be provided between the intermediate layer and the ultra-thin copper layer. The ultra-thin copper layer which has a carrier is a copper heat dissipation material according to one of the embodiments of the present invention. The thickness of the ultra-thin copper layer, although it is not particularly limited, is generally lower than the thickness of the carrier, for example, 12 µm or less, typically 0.5 to 12 µm and more typically 1.5 to 5 µm. Before an ultra-thin copper layer is provided on the intermediate layer, in order to reduce the number of pinholes in the ultra-thin copper layer, strike plating by e.g., a copper-phosphorus alloy may be applied. As the strike plating liquid, for example, a copper pyrophosphate plating liquid may be mentioned. Note that the ultra-thin copper layer may be provided on both surfaces of the carrier.

Furthermore, the ultra-thin copper layer of the invention may be an ultra-thin copper layer formed in the following conditions. This is for controlling Sz, Sa and Sku and surface area ratio A/B of the ultra-thin copper layer surface, when an alloy layer as mentioned above is provided on the surface of the ultra-thin copper layer opposite to the surface in contact with the intermediate layer, in order to control Sz, Sa and Sku and surface area ratio A/B of the alloy layer surface to fall within the scope of the present invention.

Electrolyte Composition
Copper: 80 to 120 g/L
Sulfuric acid: 80 to 120 g/L
Chlorine: 30 to 100 ppm
Leveling agent 1 (bis(3-sulfopropyl)disulfide): 10 to 30 ppm
Leveling agent 2 (amine compound): 10 to 30 ppm
As the above amine compound, an amine compound represented by the following chemical formula can be used.

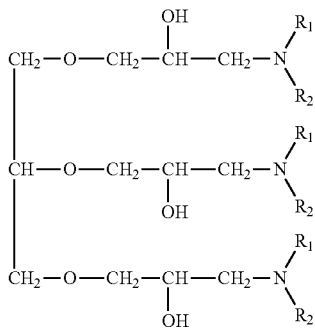

(where $R_1$ and $R_2$ each are selected from the group consisting of a hydroxyalkyl group, an ether group, an aryl group, an aromatic-substituted alkyl group, an unsaturated hydrocarbon group and an alkyl group)

Manufacturing Conditions
Current density: 70 to 100 A/dm$^2$
Electrolyte temperature: 50 to 65° C.
Electrolyte line speed: 1.5 to 5 m/sec
Electrolysis time: 0.5 to 10 minutes (controlled in accordance with the thickness of copper to be precipitated and current density)

Resin Layer

The copper heat dissipation material of the invention may have a resin layer on one or both surfaces. The surface of the copper heat dissipation material on which the resin layer is to be provided may be a treated surface. The resin layer may be an insulating resin layer. Note that if a roughening treatment is applied and thereafter surface treatments for providing a heat resistant layer, a rustproofing layer and a weather-resistant layer, are applied, the "treated surface" in the copper heat dissipation material of the invention refers to the surface to which the treatments are applied. If the copper heat dissipation material is an ultra-thin copper layer of a carrier-attached copper foil and if a roughening treatment is applied and thereafter surface treatments for providing a heat resistant layer, a rustproofing layer and a weather-resistant layer are applied thereto, the "treated surface" refers to the surface of the ultra-thin copper layer to which the treatments are applied.

The resin layer may be an adhesive layer and may be an insulating resin layer in a semi-cured state (B-stage), serving as an adhesive. The semi-cured state (B-stage) include a state where the surface thereof is not sticky if touched by a finger; the insulating resin layers of this state can be laminated and stored; and a curing reaction proceeds if a heating treatment is further applied.

The resin layer may be formed of a bonding resin, i.e., an adhesive, or an insulating resin layer in a semi-cured state (B-stage), serving as an adhesive. The semi-cured state (B-stage) include a state where the surface thereof is not sticky if touched by a finger; the insulating resin layers of this state can be laminated and stored; and a curing reaction proceeds if a heating treatment is further applied.

The resin layer may contain a thermosetting resin or may be formed of a thermoplastic resin. The resin layer may contain a thermoplastic resin. The resin layer may contain e.g., a resin known in the art, a resin curing agent, a compound, a curing accelerator, a dielectric substance, a reaction catalyst, a crosslinking agent, a polymer, a prepreg and a skeletal material. Furthermore, the resin layer may be formed of the substances (resins, resin curing agents, compounds, curing accelerator, a dielectric substance, reaction catalyst, crosslinking agent, a polymer, a prepreg and a skeletal material) described, for example in International Publication No. WO2008/004399, International Publication No. WO2008/053878, International Publication No. WO2009/084533, Japanese Patent Laid-Open No. 11-5828, Japanese Patent Laid-Open No. 11-140281, Japanese Patent No. 3184485, International Publication No. WO97/02728, Japanese Patent No. 3676375, Japanese Patent Laid-Open No. 2000-43188, Japanese Patent No. 3612594, Japanese Patent Laid-Open No. 2002-179772, Japanese Patent Laid-Open No. 2002-359444, Japanese Patent Laid-Open No. 2003-304068, Japanese Patent No. 3992225, Japanese Patent Laid-Open No. 2003-249739, Japanese Patent No. 4136509, Japanese Patent Laid-Open No. 2004-82687, Japanese Patent No. 4025177, Japanese Patent Laid-Open No. 2004-349654, Japanese Patent No. 4286060, Japanese Patent Laid-Open No. 2005-262506, Japanese Patent No. 4570070, Japanese Patent Laid-Open No. 2005-53218, Japanese Patent No. 3949676, Japanese Patent No. 4178415, International Publication No. WO2004/005588, Japanese Patent Laid-Open No. 2006-257153, Japanese Patent Laid-Open No. 2007-326923, Japanese Patent Laid-Open No. 2008-111169, Japanese Patent No. 5024930, International Publication No. WO2006/028207, Japanese Patent No. 4828427, Japanese Patent Laid-Open No. 2009-67029, International Publication No. WO2006/134868, Japanese Patent No. 5046927, Japanese Patent Laid-Open No. 2009-173017, International Publication No. WO2007/105635, Japanese Patent No. 5180815, International Publication No. WO2008/114858, International Publication No. WO2009/008471, Japanese Patent Laid-Open No. 2011-14727, International Publication No. WO2009/001850, International Publication No. WO2009/145179, International Publication No. WO2011/068157 and Japanese Patent Laid-Open No. 2013-19056; by using a method for forming a resin layer and/or a forming apparatus.

The type of resin forming the resin layer is not particularly limited and preferably a resin containing at least one selected from the group consisting of an epoxy resin, a polyimide resin, a polyfunctional cyanate compound, a maleimide compound, a polymaleimide compound, a maleimide resin, an aromatic maleimide resin, a polyvinyl acetal resin, a urethane resin, polyether sulfone, a polyether sulfone resin, an aromatic polyamide resin, an aromatic polyamide resin polymer, a rubber resin, a polyamine, an aromatic polyamine, a polyamide-imide resin, a rubber modified epoxy resin, a phenoxy resin, carboxyl group-modified acrylonitrile-butadiene resin, a polyphenylene oxide, a bismaleimide triazine resin, a thermosetting polyphenylene oxide resin, a cyanate resin, an anhydride of a carboxylic acid, an anhydride of a polybasic carboxylic acid, a linear polymer having a crosslinkable functional group, a polyphenylene ether resin, 2,2-bis(4-cyanatophenyl)propane, a phosphorus-containing phenol compound, manganese naphthenate, 2,2-bis(4-glycidylphenyl)propane, a polyphenylene ether-cyanate resin, a siloxane-modified polyamide-imide resin, a cyano ester resin, a phosphazene resin, a rubber-modified polyamide-imide resin, isoprene, a hydrogenated polybutadiene, polyvinyl butyral, phenoxy, a polymer epoxy, an aromatic polyamide, a fluorine resin, a bisphenol, a polyimide block copolymer resin and a cyano ester resin.

The epoxy resin has two or more epoxy groups in a molecule. Any epoxy resin can be used without problems as long as it can be used as an electrical/electron material. An epoxy resin obtained by epoxylating a compound having two or more glycidyl groups in a molecule is preferable. As the epoxy resin, a single resin selected from the group consisting of a bisphenol A type epoxy resin, a bisphenol F type epoxy resin, a bisphenol S type epoxy resin, a bisphenol AD type epoxy resin, a Novolak type epoxy resin, a cresol Novolak type epoxy resin, an alicyclic epoxy resin, a brominated epoxy resin, a phenol Novolak type epoxy resin, a naphthalene type epoxy resins, a brominated bisphenol A type epoxy resin, an o-cresol Novolak type epoxy resin, a rubber-modified bisphenol A type epoxy resin, a glycidyl amine type epoxy resin, triglycidyl isocyanurate, a glycidyl amine compound such as a N,N-diglycidylaniline, glycidyl ester compound such as diglycidyl tetrahydrophthalate, a phosphorus-containing epoxy resin, a biphenyl type epoxy resin, a biphenyl Novolak type epoxy resin, a trishydroxyphenylmethane type epoxy resin and a tetraphenyl ethane epoxy resin, may be used, or two or more resins selected from the aforementioned group are used as a mixture. Alternatively, these epoxy resins can be hydrogenated or halogenated and put in use.

As the phosphorus-containing epoxy resin, a phosphorus-containing epoxy resin known in the art can be used. The phosphorus-containing epoxy resin is preferably an epoxy resin derived from, a compound having two or more epoxy groups in a molecule such as 9,10-dihydro-9-oxa-10-phospha-phenanthrene-10-oxide.

(Case where the Resin Layer Contains a Dielectric Substance (Dielectric Substance Filler))

The resin layer may contain a dielectric substance (dielectric substance filler).

If a dielectric substance (dielectric substance filler) is added in any one of the above resin layers or resin compositions, the dielectric substance can be used for forming a capacitor layer to enhance the electric capacitance of the capacitor circuit. As the dielectric substance (dielectric substance filler), a powdery dielectric substance formed of a composite oxide having a perovskite structure such as $BaTiO_3$, $SrTiO_3$, Pb (Zr—Ti)$O_3$ (alias PZT), $PbLaTiO_3.PbLaZrO$ (alias PLZT) and $SrBi_2Ta_2O_9$ (alias SBT), is used.

A dielectric substance (dielectric substance filler) may be a powder. If the dielectric substance (dielectric substance filler) is a powder, the dielectric substance (dielectric substance filler) preferably has a particle size within the range of 0.01 µm to 3.0 µm and preferably 0.02 µm to 2.0 µm. Note that the particle size of the dielectric substance is obtained as follows. An image of a dielectric substance particle is photographed by a scanning electron microscope (SEM). Then, linear lines were drawn on the photographic image of a dielectric substance particle. The length of the longest line crossing the dielectric substance particle is defined as the diameter of the dielectric substance particle. The average of diameters of the dielectric particles in the field of view is defined as a particles size of the dielectric substance.

A resin, a resin composition and/or a compound contained in the aforementioned resin layer are dissolved in a solvent such as methyl ethyl ketone (MEK), cyclopentanone, dimethylformamide, dimethylacetamide, N-methylpyrrolidone, toluene, methanol, ethanol, propylene glycol monomethyl ether, dimethylformamide, dimethylacetamide, cyclohexanone, ethyl cellosolve, N-methyl-2-pyrrolidone, N,N-dimethylacetamide and N,N-dimethylformamide to obtain a resin liquid (resin vanish). The resin liquid is applied to a roughened surface of a copper heat dissipation material as mentioned above in accordance with e.g., a roll coater method and, if necessary, dried by heating to remove the solvent to obtain B-stage of the resin. In the drying operation, for example a hot-air drying furnace may be used. The drying temperature may be 100 to 250° C. and preferably 130 to 200° C. The composition of the resin layer is dissolved in a solvent to obtain a resin liquid containing a resin solid substance of 3 wt % to 70 wt %, preferably, 3 wt % to 60 wt %, preferably 10 wt % to 40 wt % and more preferably 25 wt % to 40 wt %. Note that using a solvent mixture of methyl ethyl ketone and cyclopentanone in dissolving is most preferable from an environment point of view, at present. Note that a solvent having a boiling point within the range of 50° C. to 200° C. is preferable used.

The resin layer is preferably a semi-cured resin film having a resin flow, which is measured in accordance with MIL-P-13949G of the MIL standard, within the range of 5% to 35%.

In the specification, the resin flow is obtained as follows. In accordance with the MIL standard (MIL-P-13949G), four 10 cm-square samples are taken from a resin-attached copper heat dissipation material having a resin thickness of 55 µm. The four samples are laminated and bonded at a press temperature of 171° C., a press pressure of 14 kgf/cm2, for a press time of 10 minutes. At that time, the weight of resin flowing out is measured and the measurement results are substituted in Expression 2 to obtain a value of resin flow.

$$\text{Resin flow (\%)} = \frac{\text{Weight of resin flowing out}}{\text{(Laminate weight)} - \text{(Copper foil weight)}} \times 100 \qquad \text{Expression 2}$$

The copper heat dissipation material having the resin layer (resin-attached copper heat dissipation material) is used in the following manner. After the resin layer is laminated on a substrate, the entire construct is subjected to thermocompression to cure the resin layer. If the copper heat dissipation material is an ultra-thin copper layer of a carrier-attached copper foil, the carrier is detached to expose the ultra-thin copper layer (naturally, the surface of the ultra-thin copper layer on the side near the intermediate layer is exposed). A predetermined wiring pattern is formed on the surface of copper heat dissipation material opposite to the surface to which a roughening treatment is applied.

If the resin-attached copper heat dissipation material is used, the number of prepregs used during manufacturing of a multilayer printed circuit board can be reduced. In addition, the thickness of the resin layer is controlled such that interlayer insulation can be ensured and a metal-clad laminate can be produced even if a prepreg material is not used at all. At this time, if the surface of the substrate is undercoated with an insulating resin, smoothness of the surface can be further improved.

Note that the case where a prepreg material is not used is economically favorable because the cost for a prepreg material can be saved and the laminating step is simplified. In addition, the thickness of the resultant multilayer printed circuit board can be reduced by the thickness of the prepreg material. As a result, an ultra-thin multilayer printed wiring board (a thickness of a single layer: 100 μm or less) is advantageously produced.

The thickness of the resin layer is preferably 0.1 to 120 μm.

If the thickness of the resin layer is lower than 0.1 μm, adhesive force reduces. If such a resin-attached copper heat dissipation material is laminated on a substrate having an interlayer material without interposing a prepreg material, it is sometimes difficult to ensure interlayer insulation with the circuit of the interlayer material. In contrast, if the thickness of the resin layer is larger than 120 μm, it becomes difficult to form a resin layer having a desired thickness in a single coating step and an extra material cost and a number of steps are required. This case may be economically disadvantageous.

Note that if the copper heat dissipation material having a resin layer is used for forming the ultra-thin multilayer printed wiring board, the resin layer having a thickness of 0.1 μm to 5 μm, more preferably 0.5 μm to 5 μm and more preferably 1 μm to 5 μm is preferably used for reducing the thickness of the multilayer printed wiring board.

Now, several manufacturing processes for a printed-wiring board using a carrier-attached copper foil according to the present invention will be described below.

In an embodiment of the method of manufacturing a printed wiring board according to the present invention, the method of the invention includes a step of preparing a carrier-attached copper foil according to the present invention and an insulating substrate, a step of laminating the carrier-attached copper foil and the insulating substrate;

a step of detaching the carrier from the carrier-attached copper foil (after the carrier-attached copper foil and the insulating substrate are laminated such that an ultra-thin copper layer faces the insulating substrate), to form a metal-clad laminate; and thereafter a step of forming a circuit by any one of a semi-additive method, a modified semi-additive method, a partly additive method and a subtractive method. The insulating substrate may have an inner layer circuit.

In the present invention, the semi-additive method refers to a method of forming a conductive pattern by applying non-electrolytic plating onto an insulating substrate or a metal foil seed layer to form a thin plating layer, forming a pattern, and thereafter applying electroplating and etching.

Accordingly, in the embodiment of the method of manufacturing a printed wiring board according to the present invention using the semi-additive method, the method of the invention includes a step of preparing a carrier-attached copper foil according to the present invention and an insulating substrate, a step of laminating the carrier-attached copper foil and the insulating substrate, a step of detaching the carrier from the carrier-attached copper foil (after the carrier-attached copper foil and the insulating substrate are laminated);

a step of completely removing an ultra-thin copper layer exposed by detaching the carrier by e.g., an etching method using a corrosive solution such as an acid, or a plasma method;

a step of forming through-holes or/and blind vias in the resin exposed by removing the ultra-thin copper layer by etching, a step of applying a desmear treatment to a region containing the through-holes or/and blind vias, a step of providing an non-electrolytic plating layer on the region containing the resin, the through-holes or/and blind vias, a step of forming a plating resist on the non-electrolytic plating layer, a step of applying light to the plating resist to remove the plating resist of a region in which the circuit is to be formed, a step of forming an electrolytic plating layer on the region in which the circuit is to be formed and the plating resist has been removed a step of removing the plating resist; and a step of removing the non-electrolytic plating layer present in the region except the region in which the circuit is to be formed, by e.g., flash etching.

In another embodiment of the method of manufacturing a printed wiring board according to the present invention using the semi-additive method, the method of the invention includes a step of preparing a carrier-attached copper foil according to the present invention and an insulating substrate, a step of laminating the carrier-attached copper foil and the insulating substrate, a step of detaching the carrier from the carrier-attached copper foil (after the carrier-attached copper foil and the insulating substrate are laminated);

a step of completely removing an ultra-thin copper layer exposed by detaching the carrier by an etching method using a corrosive solution such as an acid, or a plasma method;

a step of forming a non-electrolytic plating layer on the surface of the resin exposed by removing the ultra-thin copper layer by etching, a step of forming a plating resist on the non-electrolytic plating layer, a step of applying light to the plating resist, and thereafter removing the plating resist of a region in which the circuit is to be formed, a step of forming an electrolytic plating layer on the region in which the circuit is to be formed and the plating resist has been removed;

a step of removing the plating resist; and a step of removing the non-electrolytic plating layer and the ultra-thin copper layer present in the region except the region in which the circuit is to be formed, by e.g., flash etching.

In the present invention, the modified semi-additive method refers to a method of forming a circuit on an insulating layer by laminating a metal foil on an insulating layer, protecting a non-circuit forming portion with a plating resist, thickening a circuit forming portion with copper by electrolytic plating, removing the resist and removing the metal foil of the region except the circuit forming portion by (flash) etching.

Accordingly, in the embodiment of the method of manufacturing a printed wiring board according to the present invention using the modified semi-additive method, the method of the invention includes a step of preparing a carrier-attached copper foil according to the present invention and an insulating substrate, a step of laminating the carrier-attached copper foil and the insulating substrate, a step of detaching the carrier from the carrier-attached copper foil (after the carrier-attached copper foil and the insulating substrate are laminated);

a step of forming through-holes or/and blind vias in the ultra-thin copper layer exposed by detaching the carrier and the insulating substrate, a step of applying a desmear treatment to a region containing the through-holes or/and blind vias, a step of providing an non-electrolytic plating layer on the region containing the through-holes or/and blind vias, a step of forming a plating resist on the surface of the ultra-thin copper layer exposed by detaching the carrier, a step of forming a circuit by electro plating (after the plating resist is formed), a step of removing the plating resist; and a step of removing the ultra-thin copper layer exposed by removing the plating resist, by flash etching.

The step of forming a circuit on the resin layer may be a step of bonding another carrier-attached copper foil to the resin layer from the side of the ultra-thin copper layer and forming the circuit using the carrier-attached copper foil attached to the resin layer. The carrier-attached copper foil to be bonded to the resin layer may be the carrier-attached copper foil of the invention. The step of forming a circuit on the resin layer may be performed by any one of a semi-additive method, a subtractive method, partly additive step and a modified semi-additive method. The carrier-attached copper foil forming a circuit on the surface may have a substrate or a resin layer on the surface of the carrier of the carrier-attached copper foil.

In another embodiment of the method of manufacturing a printed wiring board according to the present invention using the modified semi-additive method, the method of the invention includes a step of preparing a carrier-attached copper foil according to the present invention and an insulating substrate, a step of laminating the carrier-attached copper foil and the insulating substrate, a step of detaching the carrier from the carrier-attached copper foil (after the carrier-attached copper foil and the insulating substrate are laminated), a step of forming a plating resist on the ultra-thin copper layer exposed by detaching the carrier, a step of applying light to the plating resist to remove the plating resist in the region in which a circuit is to be formed, a step of forming an electrolytic plating layer on the region in which the circuit is to be formed and the plating resist has been removed, a step of removing the plating resist; and a step of removing the non-electrolytic plating layer and the ultra-thin copper layer in the region except the region in which the circuit is to be formed, by e.g., flash etching.

In the present invention, the partly additive method refers to a method of manufacturing a printed-wiring board, which includes providing a catalyst nucleus on a substrate having a conductor layer and, if necessary, having holes for through-holes and via holes, forming a conductor circuit by etching, providing a solder resist or a plating resist, as needed, and thickening the conductor circuit, e.g., through-hole and via holes, by non-electrolytic plating.

Accordingly, in the embodiment of the method of manufacturing a printed wiring board according to the present invention using the partly additive method, the method of the invention includes a step of preparing a carrier-attached copper foil according to the present invention and an insulating substrate, a step of laminating the carrier-attached copper foil and the insulating substrate, a step of detaching the carrier from the carrier-attached copper foil (after the carrier-attached copper foil and the insulating substrate are laminated), a step of forming through-holes or/and blind vias in the ultra-thin copper layer exposed by detaching the carrier and the insulating substrate, a step of applying a desmear treatment to the region containing the through-hole or/and blind vias, a step of providing a catalyst nucleus to the region containing the through-hole or/and blind vias, a step of providing an etching resist to the ultra-thin copper layer surface exposed by detaching the carrier, a step of forming a circuit pattern by applying light to the etching resist, a step of forming a circuit by removing the ultra-thin copper layer and the catalyst nucleus by e.g., an etching method using a corrosive solution such as an acid, or a plasma method, a step of removing the etching resist, a step of forming a solder resist or a plating resist on the surface of the insulating substrate exposed by removing the ultra-thin copper layer and the catalyst nucleus by e.g., an etching method using a corrosive solution such as an acid, or a plasma method; and a step of providing a non-electrolytic plating layer in the region in which neither the solder resist nor plating resist is provided.

In the present invention, the subtractive method refers to a method of forming a conductive pattern by selectively removing an unwanted part in the copper foil on a metal-clad laminate by e.g., etching.

Accordingly, in the embodiment of the method of manufacturing a printed wiring board according to the present invention using the subtractive method, the method of the invention includes a step of preparing a carrier-attached copper foil according to the present invention and an insulating substrate, a step of laminating the carrier-attached copper foil and the insulating substrate, a step of detaching the carrier from the carrier-attached copper foil (after the carrier-attached copper foil and the insulating substrate are laminated), a step of forming through-holes or/and blind vias in the ultra-thin copper layer exposed by detaching the carrier and insulating substrate, a step of applying a desmear treatment to the region containing the through-hole or/and blind vias, a step of providing an non-electrolytic plating layer in the region containing the through-hole or/and blind vias, a step of providing an electrolytic plating layer on the surface of the non-electrolytic plating layer, a step of providing an etching resist on the surface of the electrolytic plating layer or/and the ultra-thin copper layer, a step of forming a circuit pattern by applying light to the etching resist, a step of forming a circuit by removing the ultra-thin copper layer, non-electrolytic plating layer and electrolytic plating layer by e.g., an etching method using a corrosive solution such as an acid, or a plasma method; and a step of removing the etching resist.

In another embodiment of the method of manufacturing a printed wiring board according to the present invention using the subtractive method, the method of the invention includes a step of preparing a carrier-attached copper foil according to the present invention and an insulating substrate, a step of laminating the carrier-attached copper foil and the insulating substrate, a step of detaching the carrier from the carrier-attached copper foil (after the carrier-attached copper foil and the insulating substrate are laminated), a step of forming through-holes or/and blind vias in the ultra-thin copper layer exposed by detaching the carrier and insulating substrate a step of applying a desmear treatment to the region containing the through-hole or/and blind vias, a step of providing an non-electrolytic plating layer on the region containing the through-hole or/and blind vias, a step of forming a mask on the surface of the non-electrolytic plating layer, a step of forming an electrolytic plating layer on the surface of the non-electrolytic plating layer in which no mask is formed, a step of forming an etching resist on the surface of the electrolytic plating layer or/and the ultra-thin copper layer, a step of forming a circuit pattern by applying light to the etching resist, a step of forming a circuit by removing the ultra-thin copper layer and the non-electrolytic plating layer by e.g., an etching method using a corrosive solution such as an acid, or a plasma method; and a step of removing the etching resist.

The step of forming through-holes or/and blind vias and the following desmear step may not be performed.

Now, the method of manufacturing a printed wiring board using the carrier-attached copper foil of the invention will be more specifically described below. Note that the method will be described herein with reference to a carrier-attached copper foil having an ultra-thin copper layer having a roughened layer formed; however, the invention is not limited thereto. Even if a carrier-attached copper foil having an ultra-thin copper layer having no roughened layer is used, the following method of manufacturing a printed wiring board will be similarly performed.

First, a carrier-attached copper foil (first layer) having an ultra-thin copper layer having a roughened layer formed on the surface is prepared.

Next, a resist is applied onto the roughened layer on the ultra-thin copper layer and subjected to a light exposure and development operation to etch the resist into a predetermined shape.

Next, plating for a circuit is formed and thereafter the resist is removed to form a circuit plating having a predetermined shape.

Next, an embedding resin is provided on the ultra-thin copper layer so as to cover the circuit plating (so as to bury the circuit plating) and subsequently another carrier-attached copper foil (second layer) is bonded from the side of the ultra-thin copper layer.

Next, carrier is removed from the second layer carrier-attached copper foil.

Next, holes are formed by applying laser at the predetermined positions of the resin layer and the circuit plating is exposed to light to form blind vias.

Next, blind vias are embedded with copper to form via fill.

Next, circuit plating is formed on the via fill, as described above.

Next, the carrier is removed from the firth carrier-attached copper foil.

Next, the ultra-thin copper layer of both surfaces are removed by flash etching to expose the surface of the circuit plating within the resin layer.

Next, bumps are formed on the circuit plating within the resin layer and a copper pillar is formed on the solder. In this manner, a printed-wiring board using the carrier-attached copper foil of the invention is prepared.

As the above another carrier-attached copper foil (second layer), the carrier-attached copper foil of the invention, a conventional carrier-attached copper foil or a general copper foil may be used. On the circuit on the second layer, a single-layer circuit or plural-layer circuits may be formed. These circuits may be formed by any one of a semi-additive method, a subtractive method, a partly additive step and a modified semi-additive method.

Note that as the embedding resin (resin), a resin known in the art and a prepreg can be used. For example, BT (bis-maleimide triazine) resin and a prepreg, which is glass cloth impregnated with a BT resin, ABF film and ABF manufactured by Ajinomoto Fine-Techno Co., Inc. can be used. As the embedding resin (resin), the resin layer and/or resin and/or prepreg described in the specification can be used.

Furthermore, the carrier-attached copper foil used as the first layer may have a substrate or a resin layer on a surface. The presence of the substrate or resin layer is advantageous since the carrier-attached copper foil used as the first layer is supported and wrinkle is rarely formed, with the result that productivity is improved. Note that as the substrate or resin layer, any substrate or resin layer may be used as long as it has an effect of supporting the carrier-attached copper foil used as the first layer. Example of the substrate or resin layer that can be used herein include a carrier, a prepreg and a resin layer as described in the specification as the carrier or the resin layer; a carrier, a prepreg, a resin layer, a metal plate, a metal foil, a plate of an inorganic compound, a foil of an inorganic compound, a board of an organic compound and a foil of an organic compound known in the art.

A laminate can be formed by bonding the copper heat dissipation material of the invention to a resin substrate from the side of the surface treated layer or the side opposite to the surface treated layer. The resin substrate is not particularly limited as long as it has properties applicable to e.g., a printed-wiring board. Examples of the resin substrate that can be used for a rigid PWB include a paper based phenol resin, a paper based epoxy resin, a synthetic fiber cloth based epoxy resin, a cloth impregnated with a fluorine resin, a glass cloth/paper composite based epoxy resin, a glass cloth/non-woven glass cloth composite based epoxy resin and a glass cloth based epoxy resin. Examples of the resin substrate that can be used for a flexible printed circuit board (FPC) include a polyester film and a polyimide film, a liquid crystal polymer (LCP) film, a fluorine resin and a fluorine resin/polyimide composite. Note that since the dielectric loss of the liquid crystal polymer (LCP) is low, a liquid crystal polymer (LCP) film is preferably used in a printed-wiring board for a high-frequency circuit.

The copper heat dissipation material can be bonded to a substrate for a rigid PWB in accordance with the following method. First, a prepreg is prepared by impregnating a substrate such as glass cloth with a resin and hardening the resin up to a semi-cured state. Then, a copper foil is laminated on the prepreg and heated/pressured.

In the case of an FPC, a laminate can be formed by laminating and bonding a copper foil to a substrate such as a liquid crystal polymer and a polyimide film, with an adhesive or without an adhesive interposed therein under a high temperature and a high pressure or by applying a polyimide precursor on the substrate followed by drying and curing.

The laminate of the invention can be used in various types of printed-wiring boards (PWB), which are not particularly limited. In consideration of the number of conductive pattern layers, the laminate is applicable, for example, to a one-sided PWB, a two-sided PWB and a multilayered PWB (three layers or more). In contrast, in consideration of the types of insulating substrate materials, the laminate is applicable to rigid PWB, flexible PWB (FPC) and rigid/flex PWB.

The copper heat dissipation material of the invention or the carrier-attached copper foil of the invention may be laminated on a resin substrate or substrate (which may be formed of a metal material, an inorganic material, an organic material, a ceramic) such that a surface treated layer side or the opposite side thereof faces to the substrate, or laminating on a chassis, a metal processed member, an electronic component, an electronic device, a liquid crystal panel or a display to form a laminate.

The laminate may have a pressure-sensitive adhesive layer or an adhesive layer between the copper heat dissipation material of the invention or the carrier-attached copper foil of the invention and the resin substrate or the substrate. The pressure-sensitive adhesive layer may be a layer using a conductive adhesive or a layer using a conductive acrylic adhesive. The resin substrate or substrate may be a separator. The separator refers to a resin substrate or a substrate, which enables the pressure-sensitive adhesive layer or adhesive layer and the copper heat dissipation material of the invention or the carrier-attached copper foil of the invention to be separated from the laminate. The copper heat dissipation material of the invention or the carrier-attached copper foil of the invention and the resin substrate or the substrate may be detachable.

If the laminate is a laminate having a pressure-sensitive adhesive layer or an adhesive layer between the copper heat dissipation material of the invention or the carrier-attached copper foil of the invention and the resin substrate and the substrate, the copper heat dissipation material of the invention or the carrier-attached copper foil of the invention and the resin substrate or the substrate may be detachable.

In the above case, when the copper heat dissipation material of the invention or the carrier-attached copper foil of the invention is detached from the resin substrate or the substrate, the pressure-sensitive adhesive layer or adhesive layer is exposed on the surface of the copper heat dissipation material of the invention or the carrier-attached copper foil of the invention. Because of this, the copper heat dissipation material of the invention or the carrier-attached copper foil of the invention, from which the resin substrate or substrate is detached, can be laminated on another object. The laminate may have the copper heat dissipation material of the invention or the carrier-attached copper foil of the invention on both sides of the resin substrate or the substrate.

Note that, as the pressure-sensitive adhesive layer and adhesive layer, e.g., a pressure-sensitive adhesive and an adhesive known in the art, the resin layer described in the specification and a resin that can be used in the resin layer described in the specification, can be used.

A printed-wiring board and a copper clad laminate board can be manufactured by using the copper heat dissipation material of the invention. The printed-wiring board manufactured by using the copper material of the present invention can be used in electronic devices. The copper material of the present invention can be used as e.g., a supporting substrate to be used in manufacturing a negative electrode current collector for a secondary battery, a secondary battery and a coreless multilayer printed wiring board.

EXAMPLES

Examples 1 to 11, 13 to 18, Comparative Examples 1 to 8

As Examples 1 to 11, 13 to 18 and Comparative Examples 1 to 8, various types of copper substrates having the thicknesses described in Tables 1 to 4 were prepared. Next, on each of the copper substrates, alloy layers were formed; more specifically, alloy layers (1) to (3) shown in Tables 1 to 4, were formed in this order.

Example 12

As the substrate of Example 12, the following carrier-attached copper foil was prepared. First, an electrolytic copper foil, i.e., JTC foil (manufactured by JX Mining & Metals Corporation) having a thickness of 18 μm was prepared as a carrier. Then, an intermediate layer was formed on the glossy surface of the carrier in the following conditions and an ultra-thin copper layer was formed on the intermediate layer.

Intermediate Layer (1) Ni Layer (Ni Plating)

The carrier was electroplated on a roll-to-roll continuous plating line in the following conditions to form a Ni layer in an amount deposited of 1000 μg/dm$^2$. The plating conditions are more specifically as follows.

Nickel sulfate: 270 to 280 g/L
Nickel chloride: 35 to 45 g/L
Nickel acetate: 10 to 20 g/L
Boric acid: 30 to 40 g/L
Gloss agent: e.g., saccharin, butynediol
Sodium dodecyl sulfate: 55 to 75 ppm
pH: 4 to 6
Bath temperature: 55 to 65° C.
Current density: 10 A/dm$^2$ (2) Cr Layer (Electrolytic Chromate Treatment)

Next, the surface of the Ni layer formed in (1) was washed with water and an acid. Subsequently, on the Ni layer, a Cr layer (amount deposited: 11 μg/dm$^2$) was formed in accordance with an electrolytic chromate treatment on the roll-to-roll continuous plating line in the following conditions.

Potassium dichromate: 1 to 10 g/L
pH: 7 to 10
Liquid temperature: 40 to 60° C.
Current density: 2 A/dm$^2$ Ultra-Thin Copper Layer Next, the surface of the Cr layer formed in (2) was washed with water and an acid. Subsequently, on the Cr layer, an ultra-thin copper layer of 5 m in thickness was formed in accordance with electrical plating on the roll-to-roll continuous plating line in the following conditions. In this manner, a carrier-attached ultra-thin copper foil was prepared.

Copper concentration: 90 to 110 g/L
Sulfuric acid concentration: 90 to 110 g/L
Chloride ion concentration: 50 to 90 ppm
Leveling agent 1 (bis(3-sulfopropyl)disulfide): 10 to 30 ppm
Leveling agent 2 (amine compound): 10 to 30 ppm Note that as the leveling agent 2, the following amine compound was used.

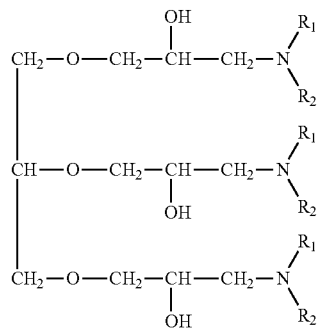

(where $R_1$ and $R_2$ each are selected from the group consisting of a hydroxyalkyl group, an ether group, an aryl group, an aromatic-substituted alkyl group, an unsaturated hydrocarbon group and an alkyl group).

Electrolyte temperature: 50 to 80° C.
Current density: 100 A/dm$^2$
Electrolyte line speed: 1.5 to 5 m/sec Surface Sz, Sa and Sku Sz, Sa and Sku of the surface of the copper heat dissipation material were measured by a laser microscope OLS4000 (LEXT OLS 4000) manufactured by Olympus Corporation in accordance with ISO25178. An area of about 200 μm×200 μm (specifically 40106 μm$^2$) was measured by use of a 50× objective lens of the laser microscope and Sz, Sa and Sku were computationally obtained. Note that, in the laser microscope measurement, if the measuring surface is not flat, i.e., a curved surface, plane correction was applied to the measurement results and then Sz, Sa and Sku were computationally obtained. Note that the environment temperature when Sz, Sa and Sku were measured by the laser microscope was set at 23 to 25° C.

Surface Area Ratio A/B

The surface area of a copper heat dissipation material surface was measured by a laser microscope OLS4000 (LEXT OLS 4000) manufactured by Olympus Corporation in accordance with ISO25178. Based on the measurement results, a surface area ratio A/B was calculated. An area of about 200 μm×200 μm (specifically 40106 μm$^2$) was measured by use of a 50× objective lens of the laser microscope. Note that the environment temperature when three-dimensional surface area A was measured by the laser microscope was set at 23 to 25° C.

Color Difference

The color difference of the surface of a copper heat dissipation material was measured using a color difference meter, MiniScan XE Plus manufactured by HunterLab, in accordance with JISZ8730 and based on the object color of a white plate (when D65 is used as a light source and a field of view is set to have a viewing angle of 10°, the tristimulus values of the $X_{10}Y_{10}Z_{10}$ color system (JIS 28701 1999) of the white plate are $X_{10}$=80.7, $Y_{10}$=85.6, $Z_{10}$=91.5 and the object color of the white plate of the L*a*b* color system is expressed by L*=94.14, a*=−0.90, b*=0.24). Note that in the aforementioned color-difference meter, the color difference is corrected, provided that the measured value of the color difference of the white plate is determined as ΔE*ab=0, the measurement value of color difference measured by covering a measurement hole with a black bag (light trap) was determined as ΔE*ab=94.14. Color difference ΔE*ab of the white plate is defined as zero and Color difference ΔE*ab of black is defined as 94.14. Note that the color difference ΔE*ab based on JIS Z8730 of a small region such as a copper circuit surface can be measured by a measurement apparatus known in the art, for Example, a micro-surface spectral color difference meter (model: e.g., VSS400) manufactured by Nippon Denshoku Industries Co., Ltd. and manufactured by a micro-surface spectrophotometer (model: e.g., SC-54μ) manufactured by Suga Test Instruments Co., Ltd.

Dusting

Dusting was evaluated by bonding a transparent mending tape on a surface, removing the tape and observing discoloration of the tape by the particles attached to the adhesive surface of the tape. The case where the color of the tape was not changed is represented by a double-circle, the case where the color of the tape was gray by a circle and the case where the color of the tape is black by X-mark.

Radiation Factor

The reflectance spectrum of the surface of a copper heat dissipation material was measured by Fourier Transform Infrared Spectroscopy (FT-IR) in the following conditions and a radiation factor was computationally obtained.

(1) Evaluation of Heat Dissipation

At the center of the surface of a substrate (Mg alloy die-casting), having a size of length d2×width w2×thickness h2=50 mm×100 mm×0.2 mm, as shown in FIG. 1, an exothermic body (an exothermic body formed of heating-wire bonded with a resin, corresponding to IC CHIP) having a size of length d1×width w1×thickness h1=5 mm×5 mm×1 mm, was placed. Next, on the surface of the substrate opposite to the surface having the exothermic body placed thereon, an adhesive layer (length d3×width w3×thickness h3=50 mm×100 mm×0.03 mm) was provided and further a copper heat dissipation material (length d4×width w4×thickness h4=50 mm×100 mm×the thickness of a copper substrate described in Table) according to each of Examples and Comparative Examples was laminated to the adhesive layer from the side of the surface opposite to the surface having the alloy layer formed thereon. A thermocouple was provided at the center of the exothermic body and at the site corresponding to the center of the exothermic body on the surface of the copper heat dissipation material opposite to the surface having the adhesive layer laminated thereon. FIG. 1 (A) shows a schematic view of the copper heat dissipation material (hereinafter referred to as "sample material") as viewed from the top. FIG. 1 (B) shows a schematic cross-sectional view of the sample material.

Next, to the exothermic body, current was supplied so as to obtain a calorific value of 0.5 W. The current supply was continued until the temperature of the top center portion of the exothermic body reached a constant value. Herein, if the temperature of the top center portion of the exothermic body did not change for 10 minutes, it was determined that the temperature of the top center portion reached the constant value. Note that the external environment temperature was set at 20° C. After the temperature of the top center portion of the exothermic body reached the constant value, the copper heat dissipation material was maintained for 30 minutes in the same state, and then the temperature displayed by the thermocouple provided on the above copper heat dissipation material was checked. It was evaluated that if the temperature displayed by the thermocouple is lower, the heat dissipation is better. Note that the temperature of the site corresponding to the center of the exothermic body on the surface of the copper heat dissipation material opposite to the surface having the adhesive layer laminated thereon is found to be highest in the copper heat dissipation board.

(2) Reflectometry

Reflectance of the above sample material to light was measured in the following conditions. Measurement was performed within the measuring surface of the sample material by turning the measurement direction 90°, twice.

Measurement apparatus: IFS-66v (FT-IR, vacuum optical system, manufactured by Bruker)
Light source: Grover (SiC)
Detector: MCT (HgCdTe)
Beam splitter: Ge/KBr
Measurement conditions: resolution=4 cm$^{-1}$
Cumulative number of times=512 times
Zero filling=2 times
Apodization=triangle
Measurement area=5000 to 715 cm$^{-1}$ (wavelength of light: 2 to 14 μm)
Measurement temperature=25° C.
Accessory equipment: transmittance, reflectance measurement integrating sphere
Port diameter=φ10 mm
Repeatability=about ±1%
Reflectometry
Incident angle: 10 degrees
Reference sample: diffuse gold (Infragold-LF Assembly)
Specular cup (specular component removal device), not attached.

(3) Re: Radiation Factor

Incident light on the surface of a sample material is reflected, transmitted or otherwise, absorbed by the interior. Absorptivity (α) (=radiation factor (∈)), reflectance (r) and transmittance (t) satisfy the following expression.

$$\in + r + t = 1 \qquad (A)$$

The radiation factor (∈) can be obtained from reflectance and transmittance as shown in the following expression.

$$\in = 1 - r - t \qquad (B)$$

In the case where a sample material is so opaque or thick that transmittance is ignorable, t=0 and thus radiation factor is determined only by reflectance.

$$\in = 1 - r \qquad (C)$$

In the sample material of the invention, since infrared light did not transmit, Expression (C) is employed and radiation factor of light of each wavelength was calculated.

(4) FT-IR Spectrum

Measurement was performed twice. The resultant average value was regarded as a reflectance spectrum. Note that the reflectance spectrum was corrected based on the reflectance of diffuse gold (display wavelength region: 2 to 14 μm).

From the radiant energy distribution of a black object at a predetermined temperature obtained by the Planck expression, the radiant energy intensity $E_{s\lambda}$ of the sample material is expressed by $$E_{s\lambda} = \in \lambda \cdot E_{b\lambda}$$

where the energy intensity at wavelength λ is represented by $E_{b\lambda}$; and the radiation factor of a sample material at wavelength λ is represented by ∈λ.

In Examples of the invention, radiant energy intensity $E_{s\lambda}$ of each sample material (which is obtained by Expression: $E_{s\lambda} = E_{b\lambda}$) was obtained at 25° C.

Furthermore, the total energy values of a black object and the sample material in a predetermined wavelength region were obtained as the integral values of $E_{s\lambda}$, $E_{b\lambda}$ in the wavelength range, the total radiation factor ∈ is represented by its ratio (the following Expression A). In Examples of the invention, total radiation factor s of each sample material at 25° C. and a wavelength region of 2 to 14 μm was calculated based on the Expression. The obtained total radiation factor was used as a radiation factor of each sample material.

$$\in = \int_{\lambda=2}^{\lambda=14} E_{s\lambda} d\lambda / \int_{\lambda=2}^{\lambda=14} Eb_\lambda d\lambda \qquad (A)$$

The conditions and test results of each test are shown in Tables 1 to 4.

TABLE 1

| | Type of copper substrate | Treatment step for copper substrate | Thickness of copper substrate [μm] | Formation of alloy layer (1) | Formation of alloy layer (2) | Formation of alloy layer (3) | Color difference | | Surface roughness (measured by laser) | | | Surface area [μm²] | Surface area ratio A/B | Dusting | Radiation factor [—] | Maximum surface temperature of copper dissipation material °C. |
|---|---|---|---|---|---|---|---|---|---|---|---|---|---|---|---|---|
| | | | | | | | | | Sz [μm] | Sa [μm] | Sku | | | | | |
| Example 1 | Tough pitch copper | General metal rolling oil film equivalent 26000 | 18 | None | None | (Ni—Zn) Current density 0.5 A/dm2 Treatment time 20 seconds Times of treatment 1 time | ΔL Δa Δb ΔE*ab | −66.4 2.7 2.6 65.2 | 20.22 | 0.19 | 63.27 | 55464.478 | 1.38 | Double-circle | 0.157 | 57.8 |
| Example 2 | Tough pitch copper | General metal rolling oil film equivalent 26000 | 18 | None | None | (Ni—Zn) Current density 1.0 A/dm2 Treatment time 20 seconds Times of treatment 1 time | ΔL Δa Δb ΔE*ab | −70.0 1.8 2.0 | 23.10 | 0.20 | 34.23 | 55864.243 | 1.39 | Circle | 0.166 | 57.7 |
| Example 3 | Tough pitch copper | General metal rolling oil film equivalent 26000 | 18 | (Ni—Zn) Current density 0.6 A/dm2 Treatment time 10 seconds Times of treatment 2 times | (Ni—Zn) Current density 0.6 A/dm2 Treatment time 10 seconds Times of treatment 2 times | (Ni—Zn) Current density 0.6 A/dm2 Treatment time 10 seconds Times of treatment 2 times | ΔL Δa Δb ΔE*ab | −82.0 5.8 −5.0 82.2 | 34.80 | 0.31 | 15.11 | 59864.243 | 1.49 | Circle | 0.222 | 57.1 |
| Example 4 | Tough pitch copper + Ag: 180 ppm | General metal rolling oil film equivalent 26000 | 18 | (Cu) Current density 65 A/dm2 Treatment time 0.5 seconds Times of treatment 2 times | (Cu) Current density 10 A/dm2 Treatment time 5 seconds Times of treatment 2 times | (Ni—Zn) Current density 0.5 A/dm2 Treatment time 20 seconds Times of treatment 1 time | ΔL Δa Δb ΔE*ab | −72.9 2.2 −3.2 73.0 | 15.92 | 0.24 | 9.14 | 55497.941 | 1.38 | Double-circle | 0.188 | 57.5 |

TABLE 1-continued

| | Type of copper substrate | Treatment step for copper substrate | Thickness of copper substrate [μm] | Formation of alloy layer (1) | Formation of alloy layer (2) | Formation of alloy layer (3) | Color difference | | Surface roughness (measured by laser) | | | Surface area [μm²] | Surface area ratio A/B | Dusting | Radiation factor [—] | Maximum surface temperature of copper dissipation material °C. |
| --- | --- | --- | --- | --- | --- | --- | --- | --- | --- | --- | --- | --- | --- | --- | --- | --- |
| | | | | | | | | | Sz [μm] | Sa [μm] | Sku | | | | | |
| Example 5 | Tough pitch copper + Ag: 180 ppm | General metal rolling oil film equivalent 26000 | 18 | (Cu) Current density 0.65 A/dm2 Treatment time 0.5 seconds Times of treatment 2 times | (Ni—Zn) Current density 0.6 A/dm2 Treatment time 10 seconds Times of treatment 2 times | (Ni—Zn) Current density 0.6 A/dm2 Treatment time 10 seconds Times of treatment 2 times | ΔL Δa Δb ΔE*ab | −86.7 1.1 −1.3 86.7 | 18.16 | 0.26 | 9.24 | 55497.941 | 1.38 | Circle | 0.190 | 57.4 |
| Example 6 | Tough pitch copper + Ag: 180 ppm | General metal rolling oil film equivalent 26000 | 12 | (Cu) Current density 55 A/dm2 Treatment time 0.5 seconds Times of treatment 2 times | (Cu) Current density 10 A/dm2 Treatment time 5 seconds Times of treatment 2 times | (Ni—Zn) Current density 0.5 A/dm2 Treatment time 20 seconds Times of treatment 1 time | ΔL Δa Δb ΔE*ab | −68.3 3.1 −4.3 68.6 | 13.23 | 0.20 | 15.31 | 54397.941 | 1.36 | Double-circle | 0.206 | 57.3 |
| Example 7 | No-oxygen copper + Ag: 100 ppm | General metal rolling oil film equivalent 26000 | 18 | (Cu—Co—Ni—P) Current density 35 A/dm2 Treatment time 0.4 seconds Times of treatment 2 times | (Cu—Co—Ni—P) Current density 45 A/dm2 Treatment time 0.4 seconds Times of treatment 2 times | None | ΔL Δa Δb ΔE*ab | −61.2 3.4 0.5 61.3 | 10.72 | 0.31 | 8.47 | 58857.025 | 1.47 | Circle | 0.200 | 57.3 |
| Example 8 | No-oxygen copper + Ag: 100 ppm | General metal rolling oil film equivalent 26000 | 18 | (Cu) Current density 55 A/dm2 Treatment time 0.7 seconds Times of treatment 2 times | (Cu) Current density 3 A/dm2 Treatment time 2 seconds Times of treatment 2 times | (Cu—Co—Ni—P) Current density 27 A/dm2 Treatment time 0.6 seconds Times of treatment 2 times | ΔL Δa Δb ΔE*ab | −48.8 4.0 1.9 49.0 | 23.85 | 0.41 | 18.03 | 57424.781 | 1.43 | Double-circle | 0.194 | 57.4 |
| Example 9 | No-oxygen copper + Ag: 100 ppm | Gross rolling oil film equivalent | 18 | (Cu—Co—Ni—P) Current density 35 A/dm2 | None | None | ΔL Δa | −52.2 2.3 | 15.58 | 0.13 | 110.95 | 53654.485 | 1.34 | Double circle | 0.124 | 58.2 |

TABLE 1-continued

| | Type of copper substrate | Treatment step for copper substrate | Thickness of copper substrate [μm] | Formation of alloy layer (1) | Formation of alloy layer (2) | Formation of alloy layer (3) | Color difference | | Surface roughness (measured by laser) Sz [μm] | Sa [μm] | Sku | Surface area [μm²] | Surface area ratio A/B | Dusting | Radiation factor [—] | Maximum surface temperature of copper dissipation material °C. |
|---|---|---|---|---|---|---|---|---|---|---|---|---|---|---|---|---|
| | | 17000 | | Treatment time 0.5 seconds Times of treatment 2 times | | | Δb | 1.7 | | | | | | | | |
| Example 10 | No-oxygen copper + Ag: 100 ppm | General metal rolling oil film equivalent 26000 | 35 | (Cu) Current density 55 A/dm2 Treatment time 0.5 seconds Times of treatment 2 times | (Cu—Ni—P) Current density 40 A/dm2 Treatment time 0.4 seconds Times of treatment 2 times | (Cu—Ni—P) Current density 35 A/dm2 Treatment time 0.4 seconds Times of treatment 2 times | ΔE*ab ΔL Δa Δb ΔE*ab | 52.3 −58.7 2.9 −1.2 58.8 | 18.76 | 0.23 | 60.12 | 54276.257 | 1.35 | Circle | 0.151 | 57.9 |
| Example 11 | Electrolytic copper foil | | 18 | (Cu) Current density 65 A/dm2 Treatment time 0.5 seconds Times of treatment 2 times | (Cu) Current density 10 A/dm2 Treatment time 5 seconds Times of treatment 2 times | (Ni—Zn) Current density 1.0 A/dm2 Treatment time 20 seconds Times of treatment 1 times | ΔL Δa Δb ΔE*ab | −77.2 2.1 −4.3 77.3 | 18.75 | 0.35 | 8.91 | 56132.735 | 1.40 | Circle | 0.200 | 58.4 |
| Example 12 | Carrier-attached copper foil | Carrier: JTC foil (Electrolytic copper foil) Intermediate layer and extremely thin copper layer are provided on S surface | 5 | (Cu) Current density 65 A/dm2 Treatment time 0.5 seconds Times of treatment 2 times | (Cu) Current density 10 A/dm2 Treatment time 5 seconds Times of treatment 2 times | (Ni—Zn) Current density 1.0 A/dm2 Treatment time 20 seconds Times of treatment 1 times | ΔL Δa Δb ΔE*ab | −77.2 2.1 −4.3 77.3 | 18.62 | 0.36 | 8.81 | 56326.639 | 1.40 | Circle | 0.200 | 58.5 |

TABLE 2

| | Type of copper substrate | Treatment step for copper substrate | Thickness of copper substrate [μm] | Formation of alloy layer (1) | Formation of alloy layer (2) | Formation of alloy layer (3) |
|---|---|---|---|---|---|---|
| Example 15 | Copper alloy (Cu—Sn0.12%) | General metal rolling oil film equivalent 26000 | 70 | (Cu) Current density 55 A/dm2 Treatment time 0.5 seconds Times of treatment 2 times | (Cu) Current density 10 A/dm2 Treatment time 5 seconds Times of treatment 2 times | (Ni—W—Sn) Current density 1.0 A/dm2 Treatment time 20 seconds Times of treatment 2 times |
| Example 16 | Copper alloy (C194 Cu—Fe2.2%—P0.03%—Zn0.15%) | General metal rolling oil film equivalent 26000 | 35 | (Cu—Ni—Mo—Fe) Current density 30 A/dm2 Treatment time 0.7 seconds Times of treatment 2 times | (Cu—Ni—Mo—Fe) Current density 40 A/dm2 Treatment time 0.5 seconds Times of treatment 2 times | (Cu—Ni—Mo—Fe) Current density 40 A/dm2 Treatment time 0.5 seconds Times of treatment 2 times |
| Example 17 | Copper alloy (C194 Cu—Fe2.2%—P0.03%—Zn0.15%) | General metal rolling oil film equivalent 26000 | 35 | (Cu—Ni—Mo—Fe) Current density 30 A/dm2 Treatment time 0.7 seconds Times of treatment 3 times | (Cu—Ni—Mo—Fe) Current density 40 A/dm2 Treatment time 0.5 seconds Times of treatment 2 times | (Cu—Ni—Mo—Fe) Current density 40 A/dm2 Treatment time 0.5 seconds Times of treatment 2 times |
| Example 18 | Copper alloy (C194 Cu—Fe2.2%—P0.03%—Zn0.15%) | General metal rolling oil film equivalent 26000 | 35 | (Cu—Ni—Mo—Fe) Current density 30 A/dm2 Treatment time 0.7 seconds Times of treatment 3 times | (Cu—Ni—Mo—Fe) Current density 40 A/dm2 Treatment time 0.5 seconds Times of treatment 3 times | (Cu—Ni—Mo—Fe) Current density 40 A/dm2 Treatment time 0.5 seconds Times of treatment 2 times |
| Comparative Example 1 | Tough pitch copper | General metal rolling oil film equivalent 26000 | 18 | None | None | None |
| Comparative Example 2 | Tough pitch copper + Ag: 180 ppm | Gross rolling oil film equivalent 17000 | 18 | None | None | None |
| Comparative Example 3 | Tough pitch copper | General metal rolling oil film equivalent 26000 | 18 | (Cu) Current density 25 A/dm2 Treatment time 0.7 seconds Times of treatment 2 times | (Cu) Current density 15 A/dm2 Treatment time 2 seconds Times of treatment 2 times | None |
| Comparative Example 4 | SUS304 (Fe—Cr18%—Ni8%) | General metal rolling oil film equivalent 26000 | 18 | (Cu) Current density 55 A/dm2 Treatment time 0.7 seconds Times of treatment 2 times | (Cu) Current density 3 A/dm2 Treatment time 2 seconds Times of treatment 2 times | (Cu—Co—Ni—P) Current density 27 A/dm2 Treatment time 0.6 seconds Times of treatment 2 times |
| Comparative Example 7 | Copper alloy (Cu—Sn0.12%) | General metal rolling | 70 | None | None | None |

TABLE 2-continued

| | | | | | | |
|---|---|---|---|---|---|---|
| Comparative Example 8 | Copper alloy (C194 Cu—Fe2.2%—P0.03%—Zn0.15%) | oil film equivalent 26000 General metal rolling oil film equivalent 26000 | 35 | None | None | None |

| | | Color difference | Surface roughness (measured by laser) | | | Surface area [μm²] | Surface area ratio A/B | Dusting | Radiation factor [—] | Maximum surface temperature of copper dissipation material °C. |
|---|---|---|---|---|---|---|---|---|---|---|
| | | | Sz [μm] | Sa [μm] | Sku | | | | | |
| Example 15 | | ΔL −63.8<br>Δa 3.5<br>Δb −2.8<br>ΔE * ab 64.0 | 22.36 | 0.33 | 18.12 | 55387.445 | 1.38 | Double-circle | 0.182 | 57.5 |
| Example 16 | | ΔL −79.3<br>Δa 2.1<br>Δb −1.2<br>ΔE * ab 79.3 | 35.00 | 0.33 | 12.35 | 59346.216 | 1.48 | Circle | 0.228 | 57.4 |
| Example 17 | | ΔL −81.7<br>Δa 2.0<br>Δb −1.0<br>ΔE * ab 81.7 | 37.50 | 0.35 | 12.70 | 60152.167 | 1.50 | Circle | 0.268 | 56.9 |
| Example 18 | | ΔL −84.1<br>Δa 2.0<br>Δb −1.0<br>ΔE * ab 84.2 | 40.80 | 0.36 | 13.10 | 61011.751 | 1.52 | Circle | 0.292 | 56.7 |
| Comparative Example 1 | | ΔL −10.4<br>Δa 15.2<br>Δb 18.0<br>ΔE * ab 25.8 | 1.18 | 0.13 | 4.08 | 52559.241 | 1.31 | None | 0.068 | 59.0 |
| Comparative Example 2 | | ΔL −11.7<br>Δa 16.3<br>Δb 21.4<br>ΔE * ab 29.3 | 0.92 | 0.10 | 5.99 | 50533.462 | 1.26 | None | 0.028 | 59.5 |
| Comparative Example 3 | | ΔL −30.5<br>Δa 28.7<br>Δb 18.9<br>ΔE * ab 45.9 | 4.80 | 0.10 | 5.06 | 51950.206 | 1.30 | Circle | 0.077 | 58.8 |
| Comparative Example 4 | | ΔL −48.7<br>Δa 3.7<br>Δb 1.7<br>ΔE * ab 48.9 | 23.78 | 0.40 | 18.01 | 57124.781 | 14.42 | Double-circle | 0.206 | 79.0 |
| Comparative Example 7 | | ΔL −10.5<br>Δa 15.3<br>Δb 17.1<br>ΔE * ab 25.2 | 1.02 | 0.11 | 4.23 | 52041.216 | 1.30 | None | 0.062 | 59.0 |
| Comparative Example 8 | | ΔL −10.4<br>Δa 15.2<br>Δb 18.0<br>ΔE * ab 25.8 | 1.05 | 0.12 | 4.15 | 52125.913 | 1.30 | None | 0.062 | 59.4 |

TABLE 3

| | Type of copper substrate | Treatment step for copper substrate | Thickness of copper substrate [μm] | Formation of alloy layer (1) | Formation of alloy layer (2) | Formation of alloy layer (3) | Color difference | |
|---|---|---|---|---|---|---|---|---|
| Example 13 | Corson alloy (C7025 Cu—Ni3.0%—Si0.65%—Mg0.15%) | General metal rolling oil film equivalent 20000 | 35 | (Cu—Co—Ni—P) Current density 45 A/dm2 Treatment time 0.4 seconds Times of | (Cr—Zn) Current density 2 A/dm2 Treatment time 2 seconds Times of | (Cr—Zn) Current density 1.5 A/dm2 Treatment time 1 seconds Times of | ΔL<br>Δa<br>Δb<br>ΔE * ab | −42.3<br>4.7<br>−6.6<br>43.1 |

TABLE 3-continued

| | | | | | treatment 2 times | treatment 2 times | treatment 2 times | | |
|---|---|---|---|---|---|---|---|---|---|
| Comparative Example 5 | Corson alloy (C7025 Cu—Ni3.0%—Si0.65%—Mg0.15%) | General metal rolling oil film equivalent 20000 | 35 | None | None | None | None | ΔL<br>Δa<br>Δb<br>ΔE * ab | -12.1<br>15.1<br>20.3<br>28.0 |

| | Surface roughness (measured by laser) | | | Surface area [μm²] | Surface area ratio A/B | Dusting | Radiation factor [—] | Maximum surface temperature of copper dissipation material ° C. |
|---|---|---|---|---|---|---|---|---|
| | Sz [μm] | Sa [μm] | Sku | | | | | |
| Example 13 | 5.02 | 0.13 | 6.24 | 53346.639 | 1.33 | Circle | 0.102 | 59.7 |
| Comparative Example 5 | 0.97 | 0.10 | 5.54 | 51093.111 | 1.27 | None | 0.029 | 60.7 |

TABLE 4

| | Type of copper substrate | Treatment step for copper substrate | Thickness of copper substrate [μm] | Formation of alloy layer (1) | Formation of alloy layer (2) | Formation of alloy layer (3) | Color difference | |
|---|---|---|---|---|---|---|---|---|
| Example 14 | Titanium copper (C1990 Cu—Ti3%) | General metal rolling oil film equivalent 26000 | 35 | (Cu—Ni—W) Current density 50 A/dm2 Treatment time 0.5 seconds Times of treatment 2 times | (Cu—Ni—W) Current density 40 A/dm2 Treatment time 0.4 seconds Times of treatment 2 times | None | ΔL<br>Δa<br>Δb<br>ΔE * ab | -57.3<br>3.1<br>-2.7<br>57.4 |
| Comparative Example 6 | Titanium copper (C1990 Cu—Ti3%) | General metal rolling oil film equivalent 26000 | 35 | None | None | None | ΔL<br>Δa<br>Δb<br>ΔE * ab | -10.5<br>18.2<br>17.5<br>27.3 |

| | Surface roughness (measured by laser) | | | Surface area [μm²] | Surface area ratio A/B | Dusting | Radiation factor [—] | Maximum surface temperature of copper dissipation material ° C. |
|---|---|---|---|---|---|---|---|---|
| | Sz [μm] | Sa [μm] | Sku | | | | | |
| Example 14 | 20.14 | 0.17 | 45.12 | 55346.721 | 1.38 | Circle | 0.154 | 64.5 |
| Comparative Example 6 | 1.11 | 0.12 | 4.09 | 52425.621 | 1.31 | None | 0.065 | 65.8 |

Evaluation Results

The sample materials of Examples 1 to 18 all had satisfactory heat dissipation.

In each of the samples of Comparative Examples 1 to 3, 5 to 8, an alloy layer was not formed, and surface roughness Sz was outside the range of 5 μm or more and heat dissipation was unsatisfactory compared to Examples.

The sample material of Comparative Example 4 uses a stainless steel substrate and showed unsatisfactory heat dissipation compared to Examples.

Furthermore, the samples of Examples were subjected to a step of forming an alloy layer on both surfaces of the copper substrate. As a result, the same properties were obtained in Examples.

What is claimed is:

1. A copper heat dissipation material having an alloy layer comprising at least one metal selected from Cu, Co, Ni, W, P, Zn, Cr, Fe, Sn and Mo on one or both surfaces, wherein surface roughness Sz of the one or both surfaces, measured by a laser microscope using laser light of 405 nm in wavelength, is 5 μm or more.

2. The copper heat dissipation material according to claim 1, wherein the surface roughness Sz of the one or both surfaces, measured by a laser microscope using laser light of 405 nm in wavelength, is 7 μm or more.

3. The copper heat dissipation material according to claim 2, wherein the surface roughness Sz of the one or both surfaces, measured by a laser microscope using laser light of 405 nm in wavelength, is 10 μm or more.

4. The copper heat dissipation material according to claim 3, wherein the surface roughness Sz of the one or both surfaces, measured by a laser microscope using laser light of 405 nm in wavelength, is 14 μm or more.

5. The copper heat dissipation material according to claim 1, wherein the surface roughness Sz of the one or both surfaces, measured by a laser microscope using laser light of 405 nm in wavelength, is 90 μm or less.

6. The copper heat dissipation material according to claim 1, wherein surface roughness Sa of the one or both surfaces, measured by a laser microscope using laser light of 405 nm in wavelength, is 0.13 μm or more.

7. The copper heat dissipation material according to claim 1, wherein surface roughness Sku of the one or both surfaces, measured by a laser microscope using laser light of 405 nm in wavelength, is 6 or more.

8. The copper heat dissipation material according to claim 1, wherein a surface area ratio A/B of surface area A of the one or both surfaces to planarly viewed area B, measured by a laser microscope using laser light of 405 nm in wavelength, is 1.35 or more.

9. The copper heat dissipation material according to claim 1, wherein color difference ΔL of the one or both surfaces based on JISZ8730 satisfies ΔL≤−35.

10. The copper heat dissipation material according to claim 1, wherein color difference Δa of the one or both surfaces based on JISZ8730 satisfies Δa≤15.

11. The copper heat dissipation material according to claim 1, wherein color difference Δb of the one or both surfaces based on JISZ8730 satisfies Δb≤17.

12. The copper heat dissipation material according to claim 1, wherein a radiation factor of the one or both surfaces is 0.092 or more.

13. The copper heat dissipation material according to claim 1, comprising a resin layer on the one or both surfaces.

14. A carrier-attached copper foil having an intermediate layer and an ultra-thin copper layer in this order on one or both surfaces of a carrier, wherein the ultra-thin copper layer is the copper heat dissipation material according to claim 1.

15. A terminal comprising the copper heat dissipation material according to claim 1.

16. A laminate manufactured by laminating the copper heat dissipation material according to claim 1; an optional pressure-sensitive adhesive layer or adhesive layer; and a resin substrate, a substrate, a chassis, a metal processed member, an electronic component, an electronic device, a liquid crystal panel, a display or a separator, in this order.

17. A printed-wiring board comprising the laminate according to claim 16.

18. A metal processed member comprising the copper heat dissipation material of claim 1.

19. An electronic device comprising the copper heat dissipation material of claim 1.

20. A method for manufacturing a printed wiring board, comprising
 a step of preparing the carrier-attached copper foil of claim 14 and an insulating substrate,
 a step of laminating the carrier-attached copper foil and the insulating substrate,
 a step of forming a metal-clad laminate by detaching carrier from the carrier-attached copper foil after the carrier-attached copper foil and the insulating substrate are laminated, and thereafter,
 a step of forming a circuit by any one of a semi-additive method, a subtractive method, a partly additive method and a modified semi-additive method.

21. A method for manufacturing a printed wiring board, comprising
 a step of forming a circuit on the surface of the ultra-thin copper layer of the carrier-attached copper foil according to claim 14 or the surface of the carrier,
 a step of forming a resin layer on the surface of the ultra-thin copper layer of the carrier-attached copper foil or the surface of the carrier so as to bury the circuit,
 a step of forming a circuit on the resin layer
 a step of detaching the carrier or the ultra-thin copper layer after the circuit is formed on the resin layer, and
 a step of exposing the circuit buried in the resin layer and formed on the surface of the ultra-thin copper layer or the surface of the carrier by removing the ultra-thin copper layer or the carrier after the carrier or the ultra-thin copper layer is detached.

* * * * *